United States Patent
Sato et al.

(10) Patent No.: US 7,432,021 B2
(45) Date of Patent: Oct. 7, 2008

(54) RETICLE, APPARATUS FOR MONITORING OPTICAL SYSTEM, METHOD FOR MONITORING OPTICAL SYSTEM, AND METHOD FOR MANUFACTURING RETICLE

(75) Inventors: Takashi Sato, Kanagawa (JP);
Masafumi Asano, Kanagawa (JP);
Hideki Kanai, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 707 days.

(21) Appl. No.: 10/890,299

(22) Filed: Jul. 14, 2004

(65) Prior Publication Data
US 2005/0048378 A1    Mar. 3, 2005

(30) Foreign Application Priority Data
Jul. 18, 2003   (JP) ............... P2003-199178

(51) Int. Cl.
*G03F 1/00* (2006.01)
(52) U.S. Cl. .......................................... 430/5
(58) Field of Classification Search ............ 430/5, 430/394; 378/35
See application file for complete search history.

(56) References Cited

U.S. PATENT DOCUMENTS

| | | | |
|---|---|---|---|
| 5,300,786 A | 4/1994 | Brunner et al. | 250/548 |
| 5,576,829 A | 11/1996 | Shiraishi et al. | |
| 5,948,571 A | 9/1999 | Mih et al. | 430/5 |
| 6,011,611 A | 1/2000 | Nomura et al. | 355/67 |
| 6,208,748 B1 | 3/2001 | Troccolo et al. | |
| 6,355,382 B1 | 3/2002 | Yasuzato et al. | 430/5 |
| 6,667,139 B2 | 12/2003 | Fujisawa et al. | 430/30 |
| 6,674,511 B2 | 1/2004 | Nomura et al. | 355/55 |
| 6,741,334 B2 | 5/2004 | Asano et al. | 355/77 |
| 2002/0021434 A1 | 2/2002 | Nomura et al. | |
| 2003/0123052 A1 | 7/2003 | Ausschnitt et al. | |
| 2004/0131951 A1 | 7/2004 | Izuha et al. | 430/5 |
| 2004/0224242 A1 | 11/2004 | Izuha et al. | |

FOREIGN PATENT DOCUMENTS

| | | |
|---|---|---|
| JP | 2-127640 | 5/1990 |
| JP | 3-5753 | 1/1991 |
| JP | 4-181251 | 6/1992 |
| JP | 6-302492 | 10/1994 |
| JP | 8-248620 | 9/1996 |
| JP | 8-286391 | 11/1996 |

(Continued)

OTHER PUBLICATIONS

Notice of Grounds for Rejection issued by the Japanese Patent Office on Mar. 27, 2007, for Japanese Patent Application No. 2003-199178 and English-language translation thereof.

(Continued)

*Primary Examiner*—Stephen Rosasco
(74) *Attorney, Agent, or Firm*—Finnegan, Henderson, Farabow, Garrett & Dunner, L.L.P.

(57) ABSTRACT

A reticle has a mask substrate, a test pattern established on the mask substrate having an asymmetrical diffraction grating so as to generate positive first order diffracting light and negative first order diffracting light in different diffraction efficiencies, and a device pattern adjacent to the test pattern established on the mask substrate.

8 Claims, 24 Drawing Sheets

FOREIGN PATENT DOCUMENTS

| | | |
|---|---|---|
| JP | 2001-100392 | 4/2001 |
| JP | 2001-102282 | 4/2001 |
| JP | 2001-189264 | 7/2001 |
| JP | 2001-351853 | 12/2001 |
| JP | 2002-55435 | 2/2002 |
| JP | 2002-289503 | 10/2002 |
| JP | 2002-299205 | 10/2002 |
| JP | 2003-114514 | 4/2003 |

OTHER PUBLICATIONS

Notice of Grounds for Rejection issued by the Japanese Patent Office on Dec. 5, 2006, for Japanese Patent Application No. 2003-199178 and English-language translation thereof.

Search Report issued by the Netherlands Patent Office on Aug. 3, 2007, for NL 1026665.

Second notice of grounds for rejection issued by the Chinese Patent Office on Mar. 21, 2008, for Chinese Patent Application No. 200410062471.1, and English-language translation thereof.

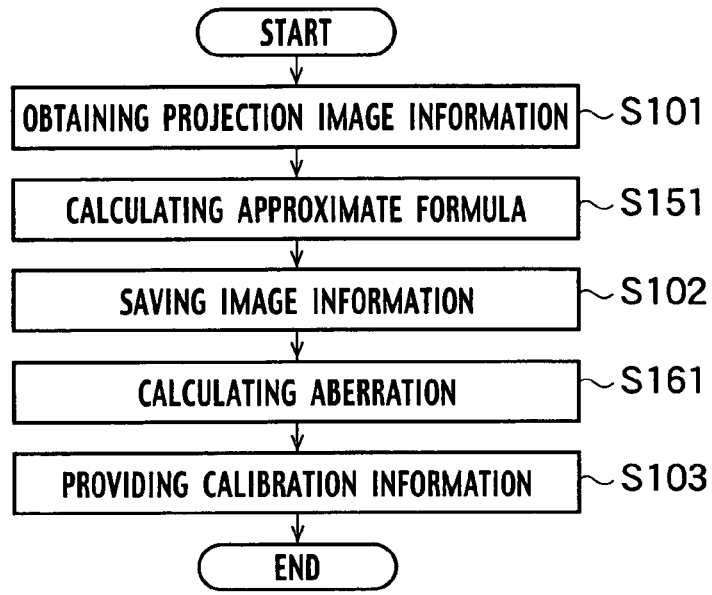
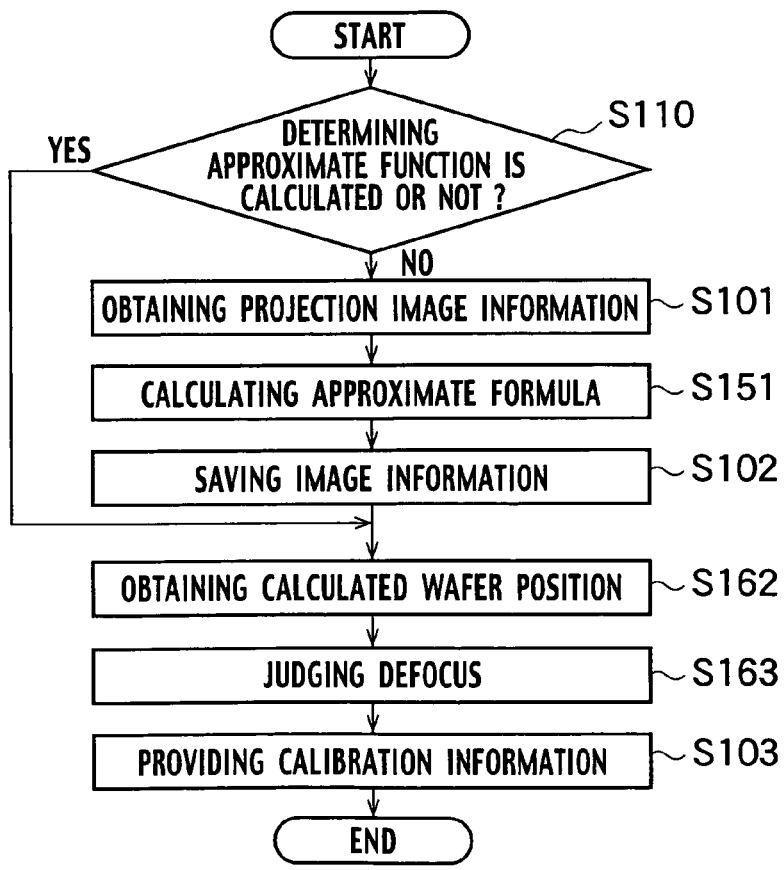

RETICLE, APPARATUS FOR MONITORING OPTICAL SYSTEM, METHOD FOR MONITORING OPTICAL SYSTEM, AND METHOD FOR MANUFACTURING RETICLE

CROSS REFERENCE TO RELATED APPLICATIONS

This application is based upon and claims the benefit of priority from prior Japanese Patent Application P2003-199178 filed on Jul. 18, 2003; the entire contents of which are incorporated by reference herein.

BACKGROUND OF THE INVENTION

1. Field of the Invention

The present invention relates to photolithographic projection and in particular to a reticle, an apparatus for monitoring optical system, a method for monitoring optical system, and a method for manufacturing the reticle.

2. Description of the Related Art

Since photolithography patterns formed on a semiconductor wafer are continually becoming increasingly fine and precise, it becomes more important to arrange precisely the wafer in the focal point. Defocus caused by wrong arrangement of the wafer brings defective products. Therefore, methods for arranging the wafer in the focal point correctly have been developed. For example, asymmetrical diffracting gratings are employed. The asymmetrical diffracting gratings have asymmetrical diffracting portions, which generate phase different of light reaching value that is larger than 0 degrees and lower than 180 degrees. Such asymmetrical diffracting gratings generate a positive first order diffracting light and a negative first order diffracting light in different diffracting efficiencies. When the asymmetrical diffracting gratings are exposed with laser light, projection images on the wafer of the asymmetrical diffracting gratings shift perpendicularly to the optical axis if the wafer is shifted in the direction of the optical axis. The shift of the projection images and the shift of the wafer have linear relation. Therefore, once the linear relation is obtained, it is possible to calculate the wafer position from measured position of the projection images. However, existing method requires preparing two reticles, one for the inspection of the wafer position, and another for exposing the device pattern on the wafer. This is because it is difficult to fabricate both the asymmetrical diffracting gratings and the device pattern on single substrate. Therefore, preparing two reticles leads the development cost to high, and exchanging the reticles interrupts continuous production. Further, defocus may be caused while the reticles are exchanged.

SUMMARY OF THE INVENTION

An aspect of present invention inheres in a reticle according to an embodiment of the present invention having a mask substrate, a test pattern established on the mask substrate having an asymmetrical diffraction grating so as to generate positive first order diffracting light and negative first order diffracting light in different diffraction efficiencies, and a device pattern adjacent to the test pattern established on the mask substrate.

Another aspect of the present invention inheres in an apparatus for monitoring an optical system according to the embodiment of the present invention having a projection image information extractor configured to obtain image information of a projection image by positive first order diffracting light and negative first order diffracting light in different diffraction efficiencies, an optical information memory configured to store the image information, and a calibration information provider configured to provide calibration information by using the image information so as to calibrate the optical system.

Yet another aspect of the present invention inheres in a computer implemented method for monitoring an optical system according to the embodiment of the present invention having obtaining image information of a projection image by positive first order diffracting light and negative first order diffracting light in different diffraction efficiencies, and providing calibration information by using the image information so as to calibrate the optical system.

Yet another aspect of the present invention inheres in a method for manufacturing a reticle according to the embodiment of the present invention including depositing a light shielding film on a mask substrate, coating a first resist film on the light shielding film and delineating first openings in the first resist film, etching the light shielding film exhibited by the first openings selectively, removing the first resist film and coating a second resist film on the mask substrate and delineating second openings in the second resist film, etching the mask substrate exhibited by the second openings selectively and fabricating a plurality of asymmetrical diffracting portions that generate positive first order diffracting light and negative first order diffracting light in different diffraction efficiencies, removing the second resist film and coating a third resist film on the mask substrate and delineating the third openings in the third resist film, and etching the mask substrate exhibited by the third openings selectively and fabricating a plurality of symmetrical diffracting portions that generate positive first order diffracting light and negative first order diffracting light in equal diffraction efficiencies.

BRIEF DESCRIPTION OF DRAWINGS

FIG. 10 is a first flowchart depicting a method for monitoring an optical system in accordance with the embodiment of the present invention;

FIG. 11 is a second flowchart depicting a method for monitoring the optical system in accordance with the embodiment of the present invention;

DETAILED DESCRIPTION OF THE INVENTION

Figure 1:
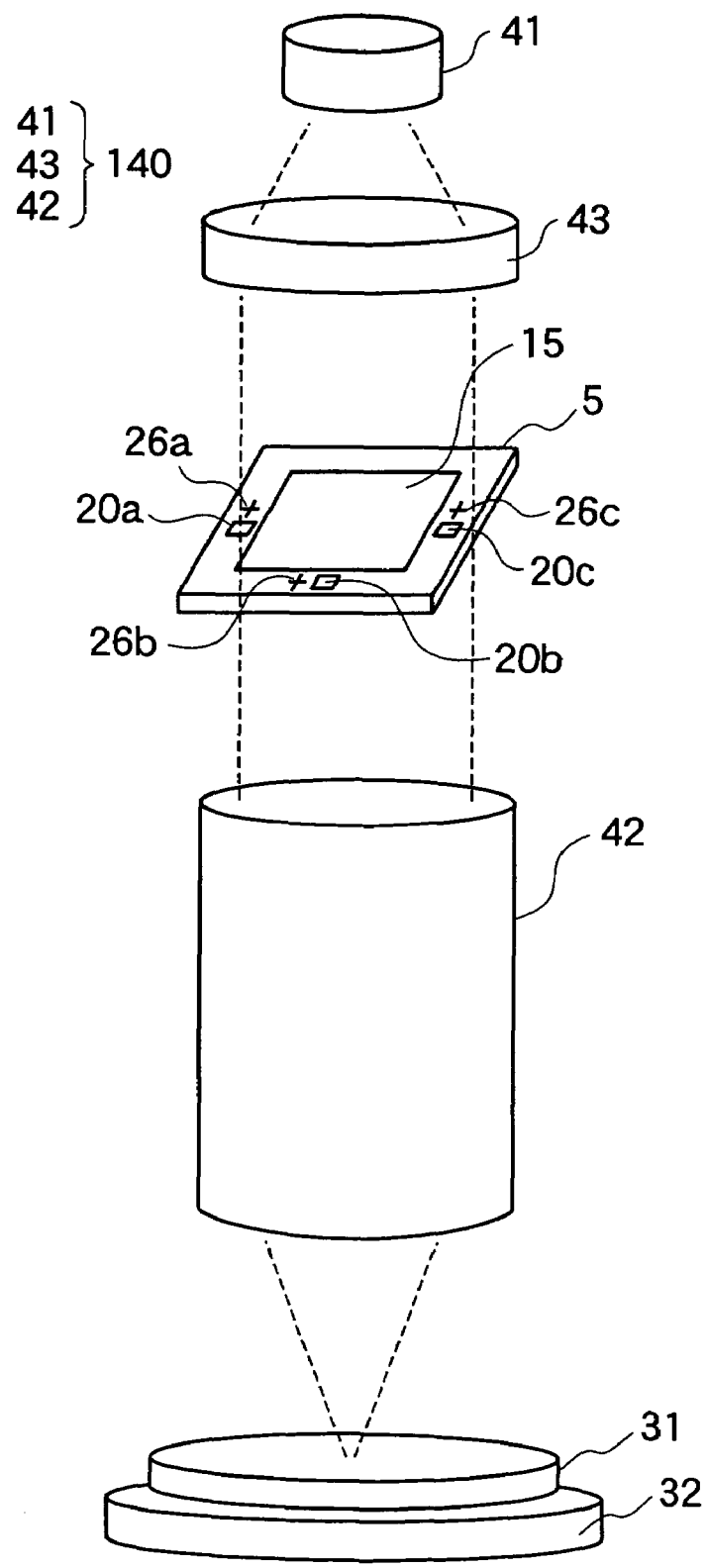
FIG. 1 is an exploded perspective view of a reduction projection exposure device in accordance with an embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

The reduction projection exposure device according to an embodiment of the present invention includes an optical system 140 and a wafer stage 32, as shown in FIG. 1. The optical system 140 includes an illumination source 41, a condenser lens 43 disposed under the illumination source 41, and a projection optical system 42 disposed under the condenser lens 43. A reticle 5 that includes a device pattern 15, a plurality of alignment marks 26a, 26b, 26c, and a plurality of test patterns 20a, 20b, 20c is disposed in between the condenser lens 43 and the projection optical system 42. The device pattern 15 takes in the light beamed from the illumination source 41 and subsequently focused by the condenser lens 43. A wafer 31 is disposed above the wafer stage 32. The light diffracted at the device pattern 15 and each of the test patterns 20a, 20b, 20c is condensed at the projection optical system 42 and imaged on the wafer 31.

Figure 2:
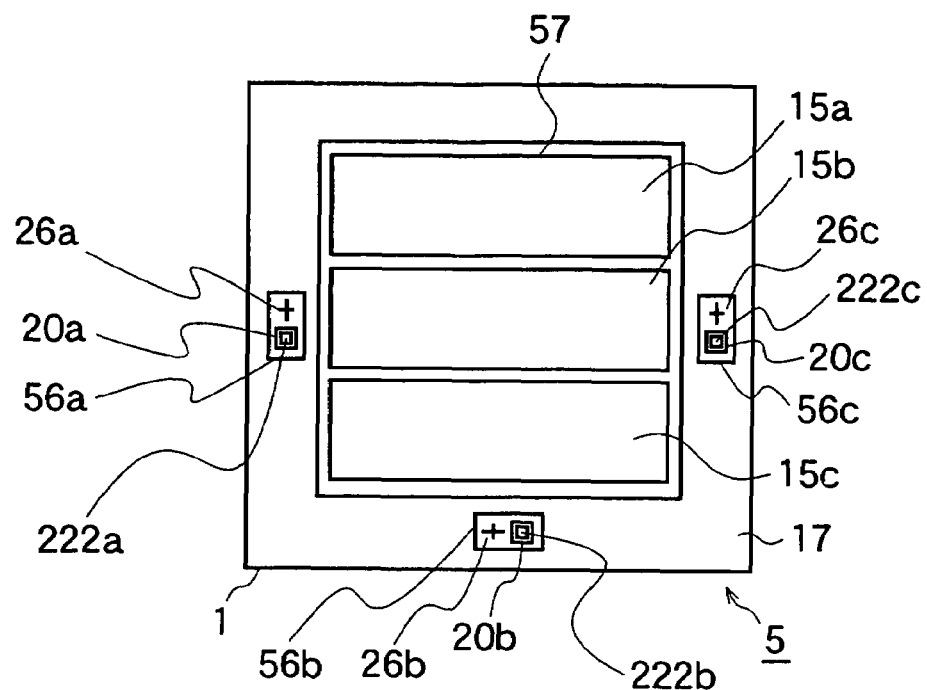
FIG. 2 is a plan view of a reticle in accordance with the embodiment of the present invention.

As depicted by the enlarged plan view shown in FIG. 2, the reticle 5 includes a mask substrate 1, a plurality of test patterns 20a, 20b, 20c established on the mask substrate 1 having an asymmetrical diffraction grating so as to generate positive first order diffracting light and negative first order diffracting light in different diffraction efficiencies, and a plurality device patterns 15a, 15b, 15c adjacent to the test patterns 20a-20c established on the mask substrate 1.

The mask 1 is transparent, and is composed of a substance such as fused silica glass. A light shielding film 17 is disposed on the mask substrate 1, and a plurality of test pattern windows 56a, 56b, 56c are established on the light shielding film 17. The light shielding film 17 is composed of a substance such as chromium (Cr). The test patterns 20a, 20b, 20c provide asymmetrical diffraction gratings 222a, 222b, 222c that are established on the mask substrate 1 and exhibited by the test pattern windows 56a, 56b, 56c. The reticle 5 also includes alignment marks 26a, 26b, 26c established on the mask substrate 1, each of the alignment marks 26a, 26b, 26c situated adjacent to one of the test patterns 20a, 20b, 20c. The test patterns 20a-20c and the alignment marks 26a-26c are disposed on the inside of exposed area, and specifically on the inside of dicing line of the mask. The reticle 5 also includes a device pattern window 57 established on the light shielding film 17, and the device patterns 15a, 15b, 15c are exhibited by the device pattern window 57. Further, the alignment marks 26a, 26b, 26c are used for the positioning alignment of the wafer 31 shown in FIG. 1.

Figure 3:
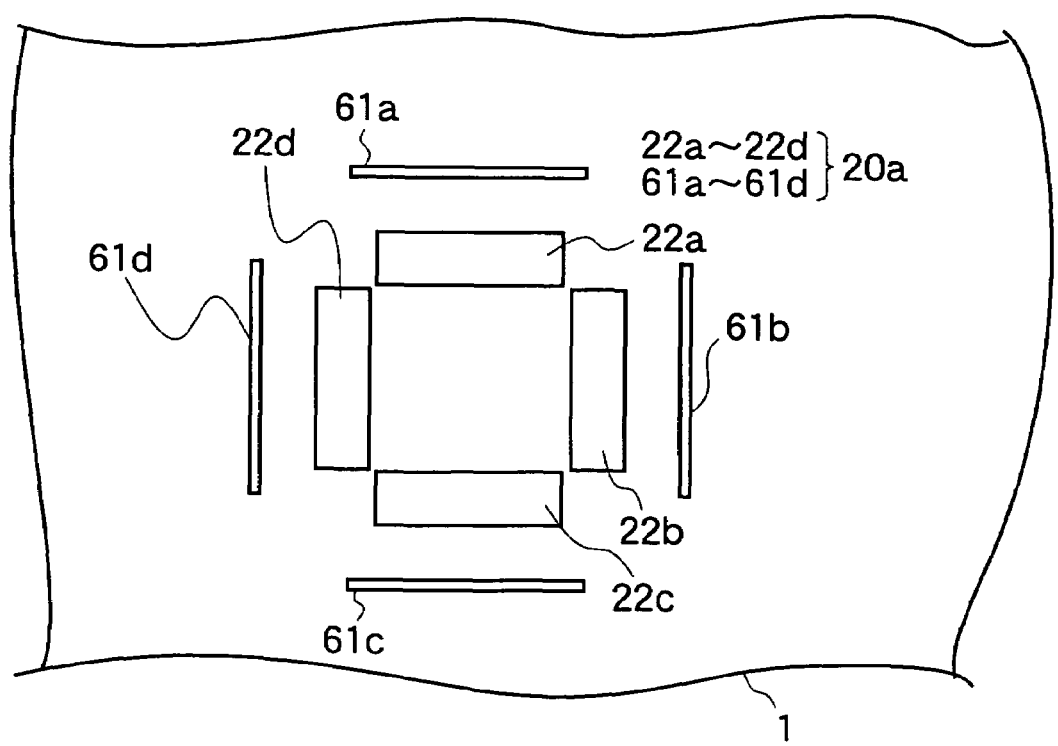
FIG. 3 is a plan view of a test pattern of the reticle in accordance with the embodiment of the present invention.

FIG. 3 is an example enlarged plan view of the test pattern 20a shown in FIG. 2. The test pattern 20a includes asymmetrical diffraction gratings 22a, 22b, 22c, 22d, and light shielding patterns 61a, 61b, 61c, 61d that are disposed parallel to each of the asymmetrical diffraction gratings 22a, 22b, 22c, 22d. The asymmetrical diffraction gratings 22a, 22b, 22c, 22d are disposed forming four sides of a square on the surface of the mask substrate 1. Each of the asymmetrical diffraction gratings 22a, 22b, 22c, 22d generates a positive first order diffracted light and a negative first order diffracted light in different diffraction efficiency. The asymmetrical diffraction gratings 22a, 22b, 22c, 22d together as a group form the asymmetrical diffraction grating 222a shown in FIG. 2. Further, the test patterns 20b, 20c possess the same constitution as the test pattern 20a shown in the enlarged plan view of FIG. 3.

Figure 4:
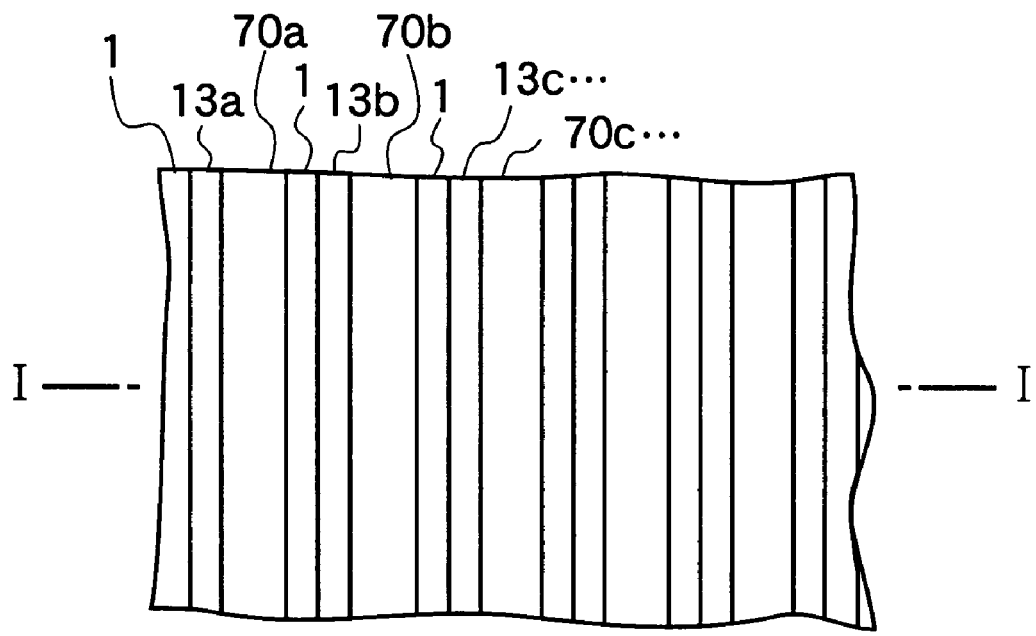
FIG. 4 is a plan view of an asymmetrical diffraction grating of the test pattern in accordance with the embodiment of the present invention.
Figure 5:
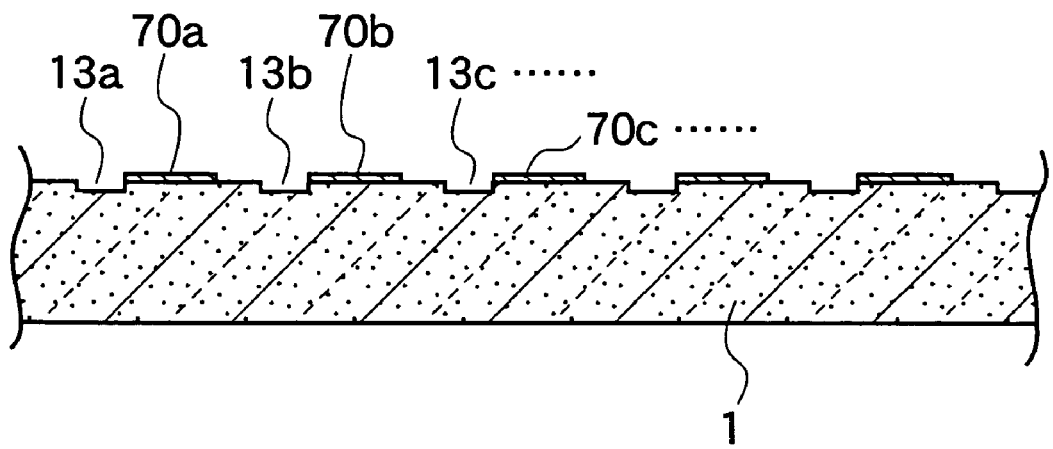
FIG. 5 is a sectional view of the asymmetrical diffraction grating in accordance with the embodiment of the present invention.

FIG. 4 is a plan view enlarging a part of the asymmetrical diffraction grating 22a shown in FIG. 3, and FIG. 5 is a cross sectional view of the asymmetrical diffraction grating 22a shown in FIG. 4 cut from the direction of the I-I line. As shown in FIGS. 4 and 5, the asymmetrical diffraction grating 22a of the test pattern 20a includes a light shielding band 70a, and an asymmetrical diffracting portion 13a that is established on the mask substrate situated adjacent to one side of the light shielding band 70a. The light shielding band 70a is disposed on the surface of the mask substrate 1 and is composed of a material such as chrome (Cr). The group made of the light shielding band 70a and the asymmetrical diffracting portions 13a paired together forms the smallest unit of the repeating pattern of the asymmetrical diffraction grating 22a, and the other light shielding bands 70b, 70c, . . . and the asymmetrical diffracting portions 13b, 13c . . . are all established on the mask substrate 1 in the same repeating pattern. Each constitution of the asymmetrical diffraction gratings 22b through 22d is similar to the asymmetrical diffraction grating 22a shown in FIGS. 4 and 5.

The ratio of the widths of the light shielding band 70a to the adjacent asymmetrical diffracting portion 13a is 2:1. The repeating pattern providing the light shielding band 70b and the adjacent asymmetrical diffracting portion 13b is established at periods of the same width of the asymmetrical diffracting portion 13a. For instance, on the reduction projection exposure device shown in FIG. 1, when irradiating an argon fluoride (ArF) excimer laser having a wavelength of 193 nm from the illumination source 41 onto the reticle 5, it is acceptable to give the light shielding band 70a a width of 0.2 µm, and give both the a symmetrical diffracting portion 13a and the period in between the light shielding band 70a and the asymmetrical diffracting portion 13b widths of 0.1 µm. The proportion of the widths of the other light shielding bands 70b, 70c, . . . , the asymmetrical diffracting portions 13b, 13c, . . . and the periods establishing the repeating pattern are established in the same manner as described above. The asymmetrical diffracting portions 13a, 13b, 13c, . . . are all groove like structures established inside of the mask substrate 1 near the top surface, at a depth where the phase difference of the exposure laser light transmitted to the surface of the mask substrate 1 is a multiple of 90 degrees. The mask substrate 1 is composed of a substance such as fused silica glass for instance, which possesses a refraction index of 1.56. When exposing with an ArF excimer laser from the illumination source 41 shown in FIG. 1 for the purpose of generating a 90 degree phase difference, each of the asymmetrical diffracting portions 13a, 13b, 13c, . . . has a depth of 86.2 nm.

Figure 6:
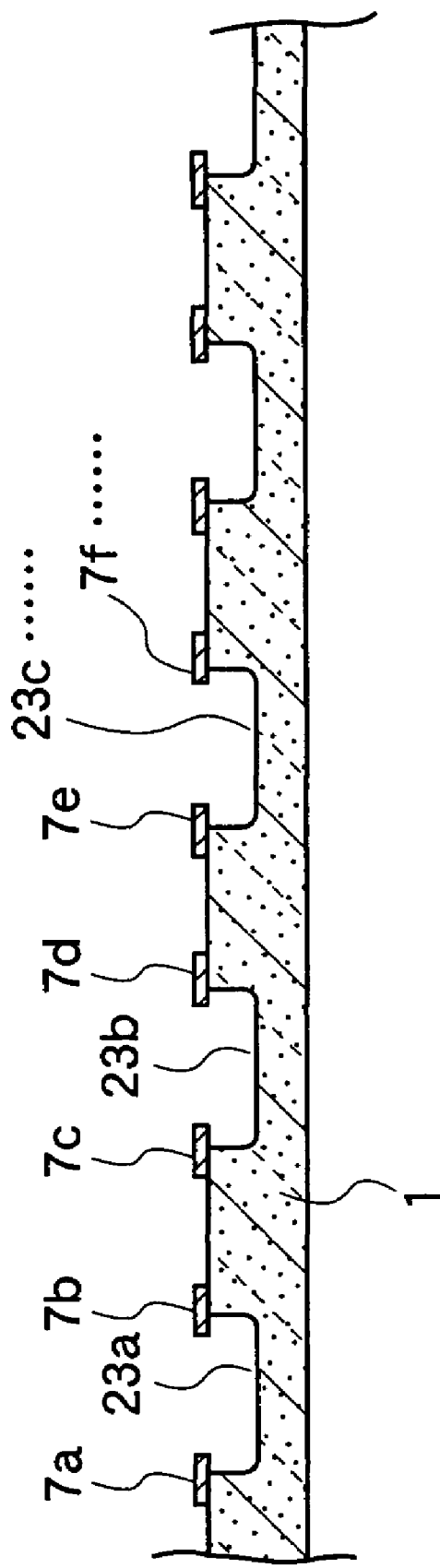
FIG. 6 is a sectional view of a device pattern of the reticle in accordance with the embodiment of the present invention.

An example of enlarged sectional view of the device pattern 15a is shown in FIG. 6. As shown in FIG. 6, the device pattern 15a includes a plurality of symmetrical diffracting portions 23a, 23b, 23c, . . . , established on the mask substrate 1, a plurality of light shielding masks 7a, 7b, 7c, 7d, 7e, 7f, . . . disposed sandwiching the symmetrical diffracting portions 23a, 23b, 23c, . . . in the upper region of the mask substrate 1. The enlarged sectional views of each of the other device patterns 15b, 15c are omitted since the device patterns 15b, 15c occur in the same manner as in FIG. 6.

Here, the symmetrical diffracting portions 23a, 23b, 23c, . . . are all groove like structures established inside of the mask substrate 1 near the top surface, at a depth where the phase difference of the exposure laser light transmitted to the surface of the mask substrate 1 is a multiple of 180 degrees. The mask substrate 1 is composed of a substance such as fused silica glass for instance, which possesses a refraction index of 1.56. When exposing with an ArF excimer laser from the illumination source 41 shown in FIG. 1 for the purpose of generating a 180 degree phase difference, the symmetrical diffracting portions 23a, 23b, 23c, . . . all have a depth of 172.3 nm.

Figure 7:
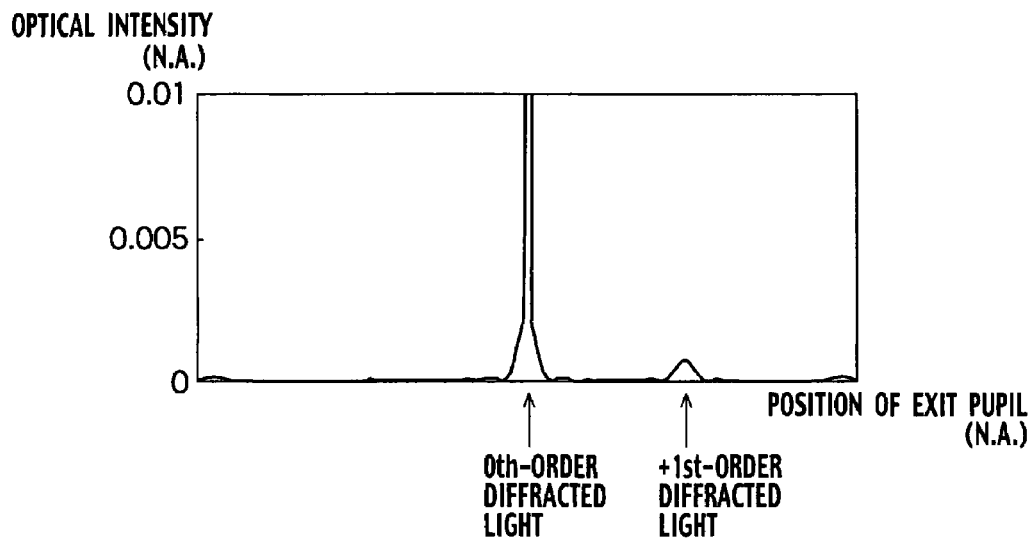
FIG. 7 is a sample graph of distribution of light intensity on surface of pupil in accordance with the embodiment of the present invention.

As shown in FIG. 2, the part where each of the test patterns 20a, 20b, 20c providing the asymmetrical diffraction gratings 22a through 22d shown in FIGS. 4 and 5 and each of the device patterns 15a, 15b, 15c shown in FIG. 6 are both established on the same mask substrate 1 is a one of features of the reticle 5 according to the embodiment of the present invention. FIG. 7 shows the results of the computation of the distribution of light intensity on the surface of the pupil, when the reticle 5 is disposed in a position where the surface having the asymmetrical diffraction gratings 22a through 22d established on the substrate 1 is facing downward, and is exposed by the ArF excimer laser from above. As shown in FIG. 7, the horizontal axis represents the position within the surface of the pupil, while the vertical axis represents the light intensity. When the light intensity is plotted in over the horizontal and vertical axes, it can be seen that a first order diffracted light appears on only the positive side in relation to the zero order diffracted light on the pupil location. If each of the asymmetrical diffracting portions 13a, 13b, 13c, . . . shown in FIG. 5 is established at a depth that will generate a phase difference of a multiple of value that is larger than 0 degrees and lower than 180 degrees on the exposure laser light transmitted to the surface of the mask substrate 1, it is possible to generate the positive first order diffracted light as well as the negative first order diffracted light of differing diffraction efficiencies. However, if the asymmetrical diffracting portions 13a, 13b, 13c, . . . are established at a depth that will generate a phase difference of 90 degrees it is possible to bias the diffraction efficiency to the most positive or most negative side. Another effective way to bias the diffraction efficiency to either the positive or negative sides is to establish the light shielding bands 70a, 70b, 70c, . . . , and the asymmetrical diffracting portions 13a, 13b, 13c, . . . , having a width ratio of 2:1, as well as establishing the repeating pattern.at an equal period to that of the asymmetrical diffracting portions 13a, 13b, 13c.

In the case where the reticle 5 includes the asymmetrical diffraction gratings 22a through 22d as shown in FIGS. 3 through 5, and when the reticle 5 is exposed with the reduction projection exposure device shown in FIG. 1, the image projected on the wafer 31 by each of the asymmetrical diffraction gratings 22a through 22d shifts perpendicularly to the optical axis when the wafer stage 32 is shifted in the direction of the optical axis. However, the projected images of the light shielding patterns 61a, 61b, 61c, 61d shown in FIG. 3 don't shift perpendicularly in relation to the optical axis even if the wafer stage 3 2 is shifted in the direction of the optical axis.

The above phenomenon can be demonstrated in theory as well. For instance, in a case where a coherent light with a wavelength of $\lambda$ is incident from the perpendicular direction to an asymmetrical diffraction grating having a grating period expressed as P and only generating first order diffracted lights to the positive side, and the level plane having the wafer disposed on it is expressed as x-y, and the optical axis direction that is directly perpendicular to x-y is expressed as z, the amplitude, expressed as E, of the light projected on the wafer can be expressed by the following formula (1):

$$E(x, z) = c_0 + c_1 \exp[2\pi I(x/P + kz - W_1)] \quad (1)$$

Here, $$k = (1 - [1 - (\lambda/P)^2]^{1/2})/\lambda \quad (2)$$

$W_1$ is diffraction phase error according to aberration, and $c_i$ is fourier intensity of the i order diffraction.

The light intensity expressed as I of the image projected on the wafer is expressed as the absolute value of the afore mentioned E to the second power, and is expressed by the following formula (3):

$$I(x, z) = |E(x, z)|^2 \quad (3)$$
$$= c_0^2 + c_1^2 + 2c_0c_1 \cos[2\pi(x/P + kz - W_1)]$$

Here, in order to obtain bright lines (bright fringes), cos $[2\pi (x/P+kz-W_1)]$ in the formula (2) must become 1. Therefore, $$x/P + kz - W_1 = 0 \quad (4)$$

When the (4) formula is differentiated by z, the formula (5) below is attained.

$$dx/dz = -kP \quad (5)$$

With the above, it can be seen that the amount of shift (dx) of the projection image from the asymmetrical diffraction grating, and the amount of shift (dz) of the wafer in the optical axis direction have a proportionate relationship.

With the reduction projection exposure device shown in FIG. 1, the wafer 31, which is a silicon substrate coated with photoresist, is situated on the wafer stage 32. The wafer 31 is gradually moved toward the optical axis, and after a number of wafers 31 have been exposed at a number of optical-axis-intersecting points, the photoresist on the wafer 31 is wet etched with a developer. The change in the relative distances of the projection image positions of both the asymmetrical diffraction grating 22a and the light shielding pattern 61a is then observed under a scanning electron microscope (SEM), an atomic force microscope (AFM) or the like.

Figure 8:
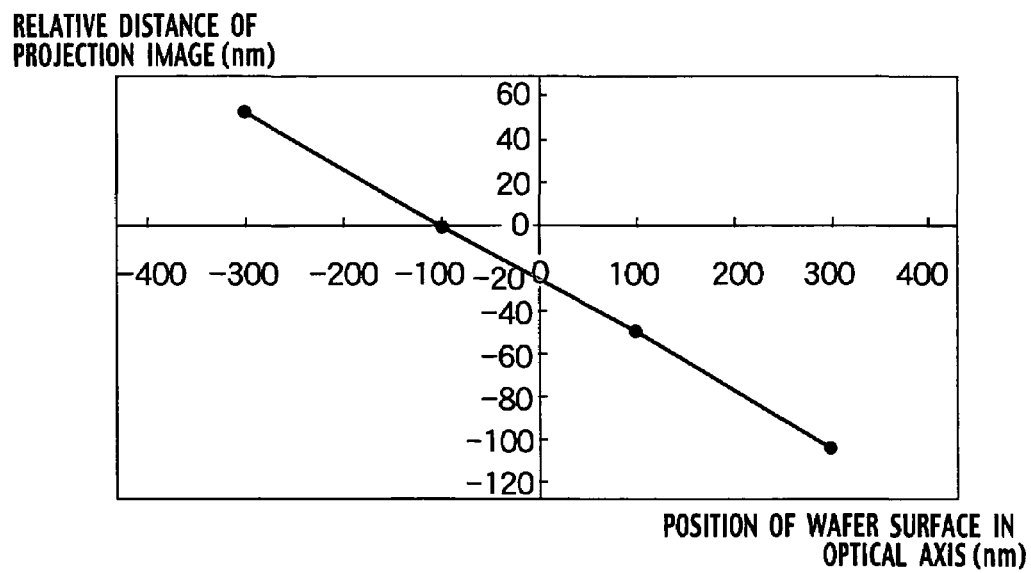
FIG. 8 is a sample graph of optical axis intersecting point versus relative distance of projection image positions in accordance with the embodiment of the present invention.

The results are shown in the graph of FIG. 8, where the horizontal axis represents the optical-axis-intersecting points on the surface of the wafer 31, and the vertical axis represents the relative distance of the projection image positions. A relationship can be seen when the wafer 31 is shifted 100 nm the relative distance undergoes an approximate change of 25 nm. The same applies to the relative distance of the projection image positions of the other asymmetrical diffraction grating 22b and light shielding pattern 61b, the asymmetrical diffraction grating 22c and light shielding pattern 61c, and the asymmetrical diffraction grating 22d and light shielding pattern 61d as well.

Therefore, it is possible to calculate the approximate formula (a linear function formula) that expresses the relation between the relative distance of the projection image positions and the optical-axis-intersecting points on the surface of the wafer 31. Consequently, the optical axis intersecting points of the wafer 31 can be derived by substituting the actual measured values of the relative distance of the projection image positions into the calculated approximate formula.

Again, in an instance where the reticle 5 providing the test pattern 20a shown in FIG. 3 is disposed on the reduction projection exposure device shown in FIG. 1, the differences in the focal points of the projected images of the asymmetrical diffraction grating 22a and the perpendicularly-adjacent asymmetrical diffraction grating 22b represent the astigmatism of the optical system 140 of the reduction projection exposure device shown in FIG. 1. Therefore, if the approximate formulas expressing the linear relationship between the projection image positions of each of the asymmetrical diffraction gratings 22a and 22b and the optical axis intersecting points of the wafer are calculated, the astigmatic aberration can be derived from the differences in the intercepts of each approximate formula. The same applies to the perpendicularly adjacent asymmetrical diffraction gratings 22b and 22c, the asymmetrical diffraction gratings 22c and 22d, and the asymmetrical diffraction gratings 22d and 22a as well.

Next, having acquired the relative distances of. the projection image positions of the asymmetrical diffraction gratings 22a, 22b, 22c, 22d and the light shielding patterns 61a, 61b, 61c, 61d of the test pattern shown in FIG. 3, an apparatus for monitoring optical system so as to derive the aberration and defocus of the optical system 140 of the reduction projection exposure device shown in FIG. 1 will be described in using FIG. 9. Specifically, the apparatus for monitoring optical system according to the embodiment of the present invention includes a central processing unit (CPU) 300, an optical information memory 335, an input device 312, an output device 313, a program memory 330 and a temporary memory 331. Further, the CPU 300 includes a projection image information extractor 325, and an calibration information provider 315.

The projection image information extractor 325 includes an approximate formula calculator 301, and acquires the information of the projection images from the asymmetrical diffraction grating 22a and the light shielding pattern 61a on the wafer 31 along with the information of the optical axis intersecting points of the wafer 31 shown in FIG. 1. Further, the projection image information extractor 325 acquires a plurality of image information at a number of optical axis intersecting points. The approximate formula calculator 301 shown in FIG. 9 extracts information expressing the relationship between the relative distance of the projection image positions of the asymmetrical diffraction grating 22a and the light shielding pattern 61a shown in FIG. 8, and the optical axis intersecting points on the surface of the wafer 31. Further, the approximate formula calculator 301 calculates the approximate formula used to express the relation between the relative distances of the projection image positions and the optical axis intersecting points. Calculation in the same manner using an approximate formula applies to the projection images from the other asymmetrical diffraction gratings 22b, 22c, 22d and light shielding patterns 61b, 61c, 61d as well.

Figure 9:
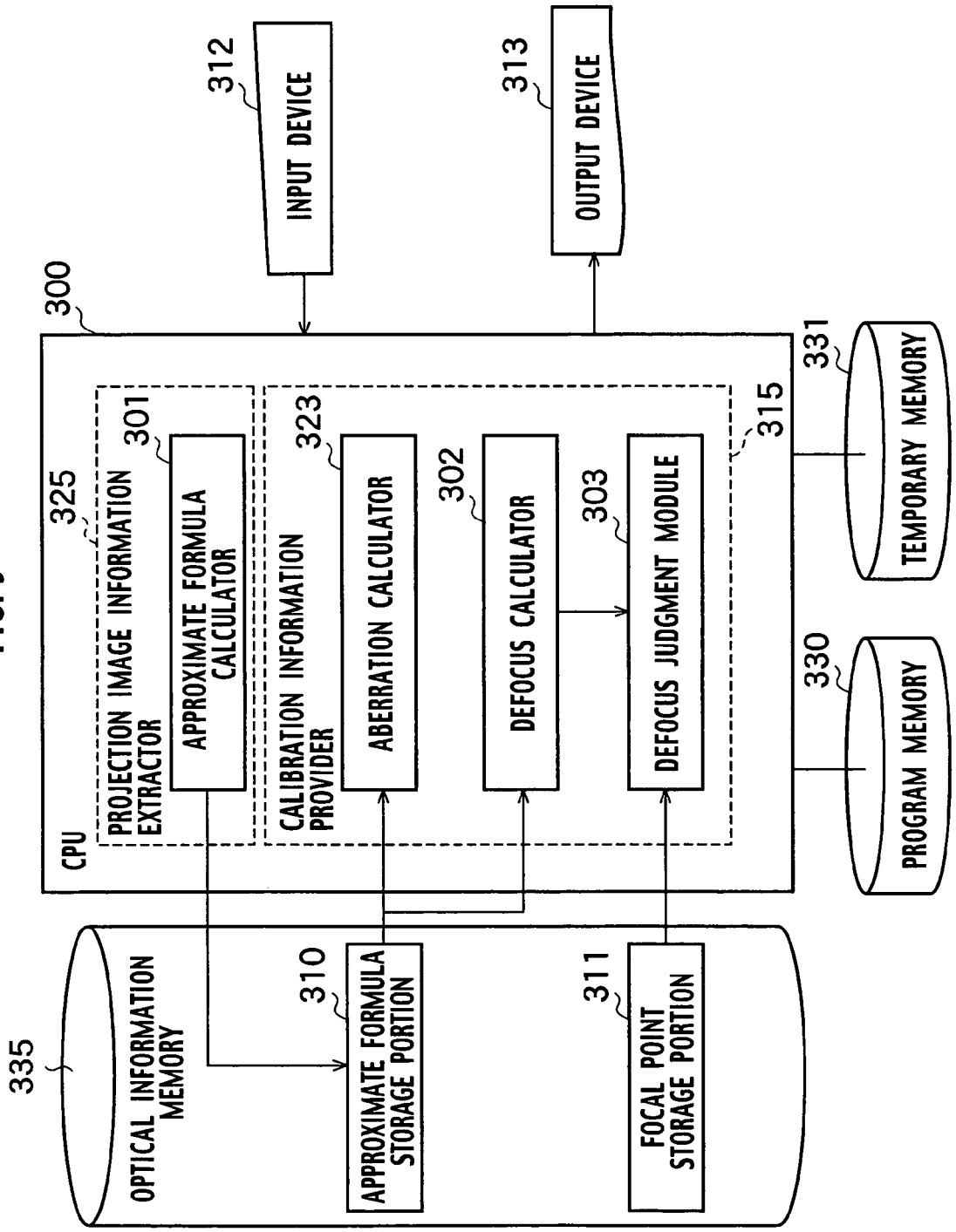
FIG. 9 is a block diagram of an apparatus for monitoring optical system in accordance with the embodiment of the present invention.

The optical information memory 335 shown in FIG. 9 includes an approximate formula storage portion 310 and a focal point storage portion 311. The approximate formula storage portion 310 stores the approximate formula calculated by the approximate formula calculator 301. The focal point storage portion 311 stores the focal point and focal depth of the optical system 140 in the reduction projection exposure device shown in FIG. 1. The theoretical values derived from the design of the optical system 140 can be stored as the focal point and the focal depth in the focal point storage portion 311. The range of optical axis intersecting points of the wafer 31, that are introduced by allowable resist patter shape on the wafer 31, can also be stored as the focal point and the focal depth. Such range is determined by previously exposing the wafer 31 with a plurality of optical axis intersecting points on the device pattern 15 of the reticle 5.

The calibration information provider 315 shown in FIG. 9 includes an aberration calculator 323, a defocus calculator 302, and a defocus judgment module 303. The aberration calculator 323 compares the plurality of approximate formulas stored by the approximate formula storage portion 310 and calculates the aberration of the optical system 140 of the reduction projection exposure device shown in FIG. 1. The defocus calculator 302 shown in FIG. 9 substitutes the relative distance of the actual measured positions of the projection images from the asymmetrical diffraction gratings 22a, 22b, 22c, 22d and the light shielding patterns 61a, 61b, 61c, 61d on the wafer 31, that are input by the input device input device 312, into the approximate formula stored in the approximate formula storage portion 310. The defocus calculator 302 then calculates the calculated position of the wafer 31. The defocus judgment module 303 shown in FIG. 9 compares the calculated position of the wafer 31 derived by the defocus calculator 302 with the focal point stored in the focal point storage portion 311, judges whether or not the defocus is within an allowable range, and outputs the resulting decision to the output device 313.

Further, keyboards, mouse pointers and the like can be used as the input device 312, and liquid crystal display devices (LCD), light emitting diodes (LED) and the like can be used as the output device 313. The program memory 330 stores programs that the CPU 300 needs to govern the transferring of data from the connected devices and calculate approximate formula and the defocus. The temporary memory 331 temporarily stores the data of the computation processes of the CPU 300.

Next, a method for monitoring the optical system using the reticle 5 shown in FIG. 2 and the apparatus for monitoring optical system shown in FIG. 9 will be described. The method for monitoring the optical system tests whether or not aberration is occurring on the optical system 140 of the reduction projection exposure device shown in FIG. 1, or whether or not the wafer 31 is properly situated on the focal point. First, the method for monitoring the optical system that calculates the aberration of the optical system 140 of the reduction projection exposure device shown in FIG. 1 will be describes using FIGS. 1, 3, 9, and 10.

(a) In a step S 101 of FIG. 10, the test patterns 20a, 20b, 20c of the reticle 5 are projected on the wafer 31 by the reduction projection exposure device shown in FIG. 1. A plurality of the wafer 31 is prepared and exposed at a plurality of optical axis intersecting points while gradually moving the wafer stage 32. After developing the wafer 31, the image information of the images from the asymmetrical diffraction gratings 22a, 22b, 22c, 22d and the light shielding patterns 61a, 61b, 61c, 61d projected onto the surface of the wafer 31 is input to the projection image information extractor 325 by the input device 312.

(b) In a step S 151, the approximate formula calculator 301 of the projection image information extractor 325 extracts the relationship of the optical axis intersecting points of the wafer 31 and the relative distance of the images from the asymmetrical diffraction grating 22a and the light shielding pattern 61a projected onto the surface of the wafer 31. Specifically, the approximate formula calculator 301 extracts the above from a plurality of image information, and subsequently calculates an approximate formula. The other approximate formulas are similarly calculated for the other asymmetrical diffraction gratings 22b through 22d and light shielding patterns 61b through 61d as well.

(c) In a step 102 the approximate formula storage portion 310 stores the approximate formulas computed by the approximate formula calculator 301. In a step S161 the aberration calculator 323 of the calibration information provider 315 reads the plurality of approximate formulas stored in the approximate formula storage portion 310, compares them and then calculates the aberration of the optical system 140. In a step S 103, the calibration information provider 315 transmits the aberration derived by the calibration information provider 315 to the output device 313, thus ending the inspection.

Next, the method for monitoring the optical system that calculates the defocus of the optical system 140 of the reduction projection exposure device shown in FIG. 1 will be describes using FIGS. 1, 3, 9, and 11.

(a) In a step S110 of FIG. 11, the approximate formula calculator 301 judges whether or not approximate formulas have already been derived for the objective reticle and are stored in approximate formula storage portion 310 shown in FIG. 9. If the approximate formulas are not stored, the approximate formula calculator 301 calculates the approximate formulas in the same manner as in the steps S101, S151, S102 appearing in the description of FIG. 10. The calculated approximate formulas are then stored in the approximate formula storage portion 310, and the test proceeds to a step S162. On the other hand, in the instance where the approximate formulas are already stored in the approximate formula storage portion 310, the test proceeds directly to the step S162.

(b) In the step S162 of FIG. 11, the approximate formula stored in the approximate formula storage portion 310 shown in FIG. 9, and the measured relative distances of the projection images on the wafer 31 inputted from the input device 312 are stored-away by the defocus calculator 302 shown in FIG. 9. The projection images on the wafer 31 shown in FIG. 1 are projected from the asymmetrical diffraction gratings 22a, 22b, 22c, 22d and the light shielding patterns 61a, 61b, 61c, 61d shown in FIG. 3. The defocus calculator 302 substitutes the actual measured values of the relative distances of the actual measured positions into the variable of the relative distance in the approximate formula, and then calculates the calculated position of the wafer 31. The calculated position is transmitted to the defocus judgment module 303 shown in FIG. 9.

(c) In a step S 163 of FIG. 11, the focal point and focal depth of the optical system 140 of the reduction projection exposure device shown in FIG. 1 are input to the defocus judgment module 303 shown in FIG. 9. The defocus judgment module 303 calculates the defocus from the difference of the focal point and the calculated position of the wafer 31 derived at the step S162. The derived defocus is compared to the focal depth, and if for instance the defocus is judged to be within the focal depth range, it is decided that the correction of the optical system 140 is unnecessary. And if for instance the defocus is judged to be outside of the focal depth range, it is decided that it is necessary to move the wafer stage 32 in the direction that will delete the derived defocus.

(d) In a step S103 of FIG. 11, the calibration information provider 315 shown in FIG. 9 transmits the judgment results obtained at the step S163 of the FIG. 11 to the output device 313, thus ending the test.

As shown above, by employing the reticle 5 shown in FIG. 2, the apparatus for monitoring optical system shown in FIG. 9, and the method for monitoring the optical system shown in FIG. 10, it becomes possible to inspect the aberration of the optical system 140 of the reduction projection exposure device shown in FIG. 1. Also, by employing the method for monitoring the optical system shown in FIG. 11, it becomes possible to inspect whether or not the wafer 31 is properly situated on the focal point on the reduction projection exposure device shown in FIG. 1. Further, in instances where defocus occurs, it is possible to adjust the focus in a short period of time by moving the wafer stage 32 in the direction that will delete the calculated defocus. Also, because the test pattern equipped testing reticles, and the device pattern equipped production reticles are separated conventionally, it is necessary to exchange the testing reticle for the production reticle after correcting an optical system with testing reticle. However, because the reticle 5 includes the test patterns 20a, 20b, 20c and the device patterns 15a-15c, it is possible to fabricate the semiconductor integrated circuit immediately after the correcting the optical system 140, without having to exchange reticles. Further, it is also possible to inspect continuously for the occurrence of abnormalities during the semiconductor integrated circuit manufacturing process. In an instance of multiple lot production of semiconductor integrated circuitry, by observing and comparing the relative distance of the projection images of the asymmetrical diffraction gratings 22a, 22b, 22c, 22d and the light shielding patterns 61a, 61b, 61c, 61d on the wafer 31 at each lot, it is possible to continuously inspect whether or not defocus is occurring on the reduction projection exposure device. Also, in instances where the defocus has exceeded the allowable range, by moving the wafer stage 32 in the direction that delete the defocus with the method for monitoring the optical system shown in FIG. 11, it is possible to immediately resume the manufacturing of semiconductor integrated circuitry. Therefore, the time that is used to adjust the focal point of the optical system of an exposure device is greatly reduced in the semiconductor integrated circuit manufacturing process, leading to a reduction in production costs.

Figure 12:
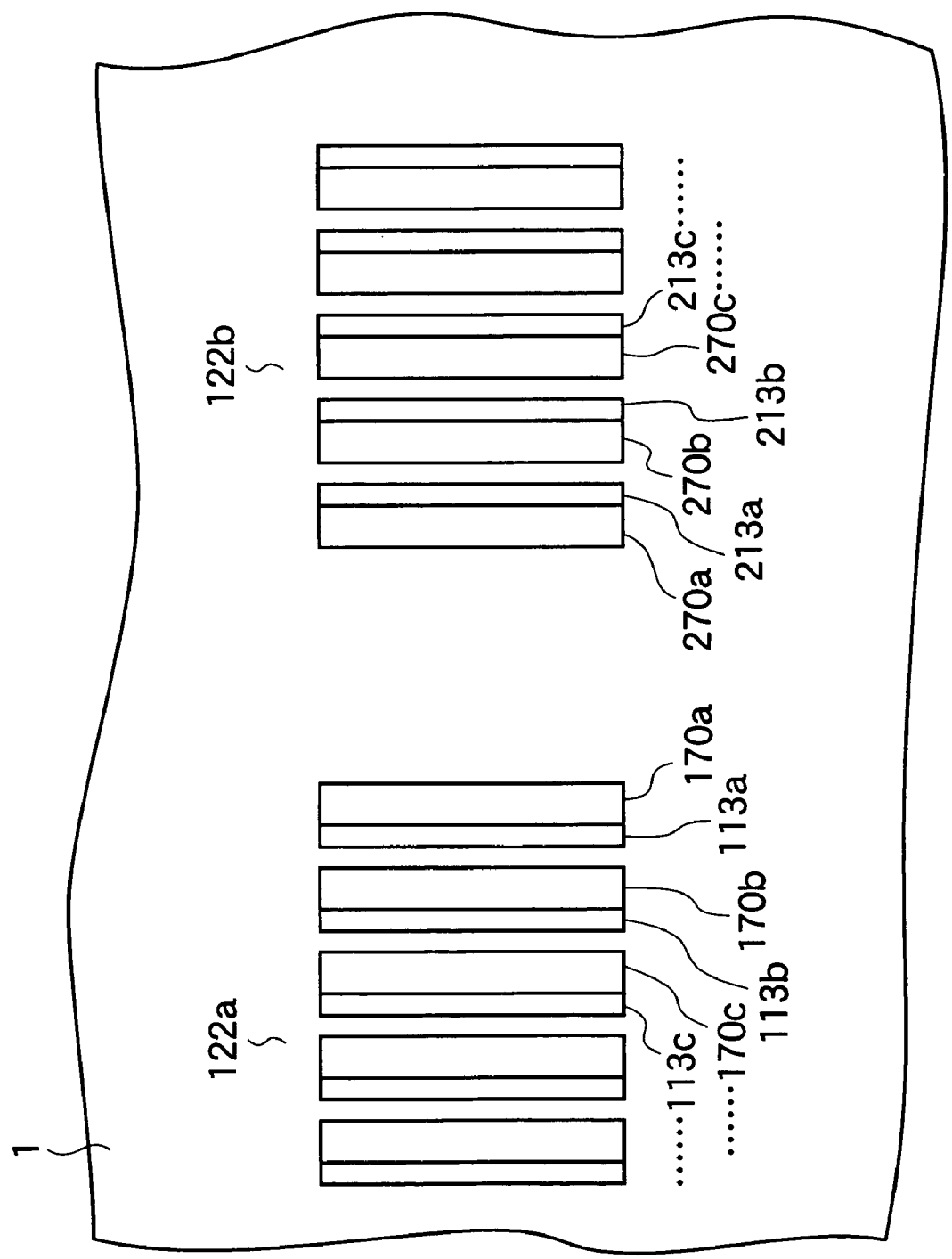
FIG. 12 is a plan view of a first modification of the test pattern in accordance with the embodiment of the present invention.
Figure 13:
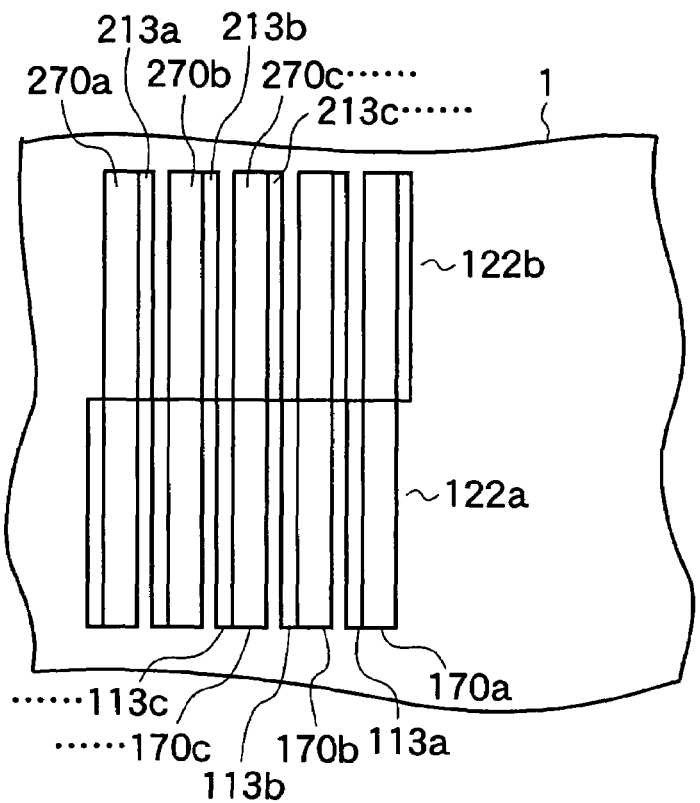
FIG. 13 is a plan view of a second modification of the test pattern in accordance with the embodiment of the present invention.
Figure 14:
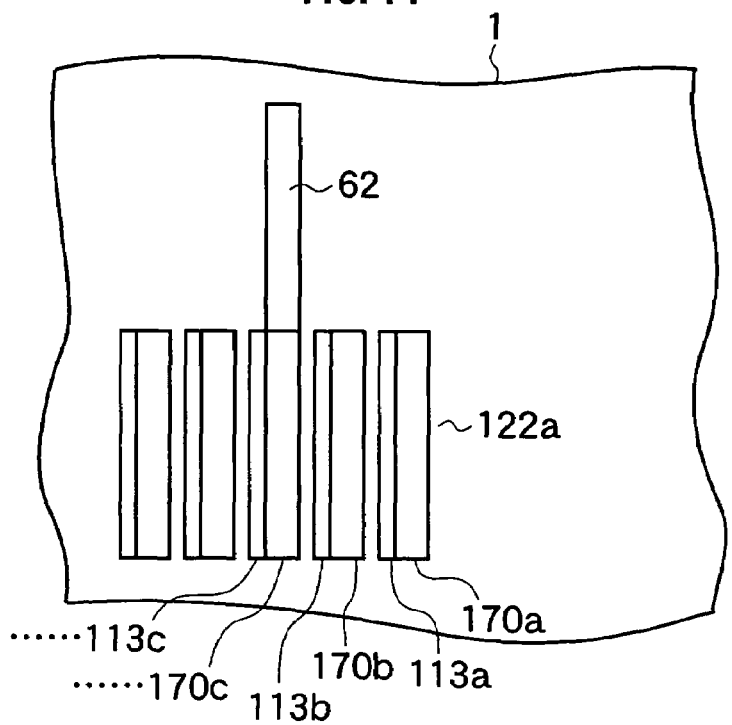
FIG. 14 is a plan view of a third modification of the test pattern in accordance with the embodiment of the present invention.

Further, the test patterns 20a, 20b, 20c of the reticle 5 shown in FIG. 2 are not limited to the arrangement shown in FIG. 3. Establishing the asymmetrical diffraction grating 122a that includes the asymmetrical diffracting portions 113a, 113b, 113c, . . . , light shielding bands 170a, 170b, 170c, . . . and the asymmetrical diffraction grating 122b that includes the asymmetrical diffracting portions 213a, 213b, 213c, . . . , light shielding bands 270a, 270b, 270c, . . . so as to flow in the opposite direction as shown in FIGS. 12 and 13 is alternative. When a reticle 5 including the asymmetrical diffraction gratings 122a, 122b is exposed with the reduction projection exposure device shown in FIG. 1, if the wafer 31 is moved in direction of the optical axis the projection image positions of the asymmetrical diffraction gratings 122a, 122b move in a mutually opposite direction on the wafer 31. Therefore, it is possible to observe the linear relationship of the projection image positions and the optical axis intersecting points of the wafer 31 at twice the sensitivity of that of the arrangement in FIG. 3. Also, as shown in FIG. 14, it is possible to measure the relative distance of the projection image positions of both the asymmetrical diffraction grating 122a and the light shielding pattern 62 by disposing the patterns of the asymmetrical diffraction grating 122a and the light shielding pattern 62 so that the longitudinal directions are the same.

Next a method for manufacturing the reticle that includes the asymmetrical diffraction grating 22a shown in FIG. 5 and the device pattern 15a shown in FIG. 6 together on the same mask substrate will be describes using FIGS. 15 to 22.

Figure 15:
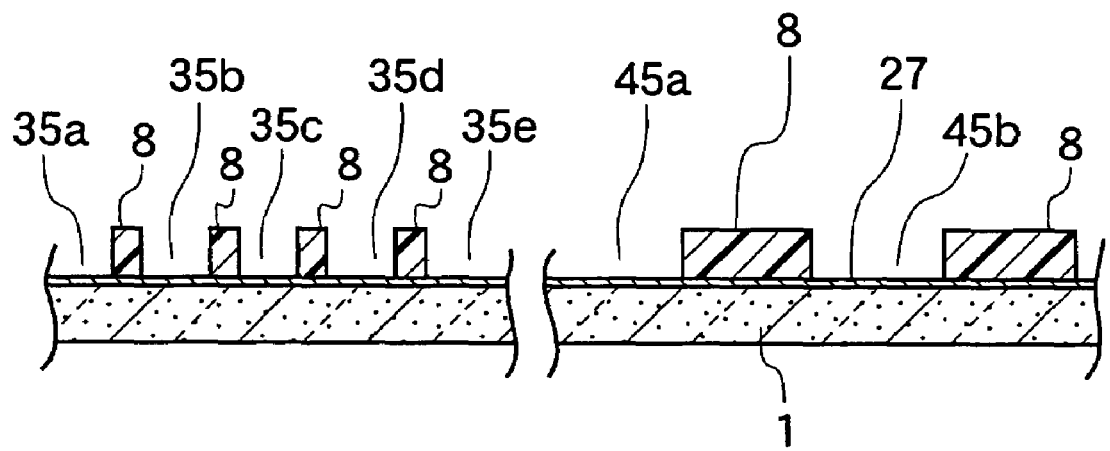
FIG. 15 is a first sectional view of the reticle depicting the manufacturing process in accordance with the embodiment of the present invention.

(a) As shown in FIG. 15, a mask substrate 1 made of a substance such as fused silica glass is prepared. Next, a light shielding film 27 made of a substance such as Chromium is deposited on the surface of the mask substrate 1 using a process such as vacuum deposition. Further, a first resist film 8 is coated on the light shielding film 27 with spin coating, and first openings 35a, 35b, 35c, 35d, 35e and first openings 45a, 45b are delineated using the photolithography process.

Figure 16:
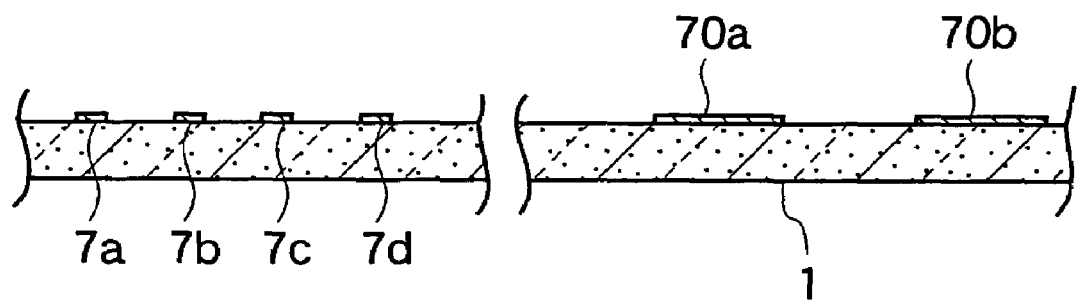
FIG. 16 is a second sectional view of the reticle depicting the manufacturing process in accordance with the embodiment of the present invention.

(b) The parts of the light shielding film 27 exhibited by the first openings 35a, 35b, 35c, 35d, 35e and first openings 45a, 45b are selectively etch away with anisotropic etching until the mask substrate is exhibited, using the first resist film 8 as a mask. Afterward the first resist film 8 is removed with using a remover agent, and the light shielding masks 7a, 7b, 7c, 7d and light shielding bands 70a, 70b are formed on the surface of the mask substrate 1, as shown in FIG. 16.

Figure 17:
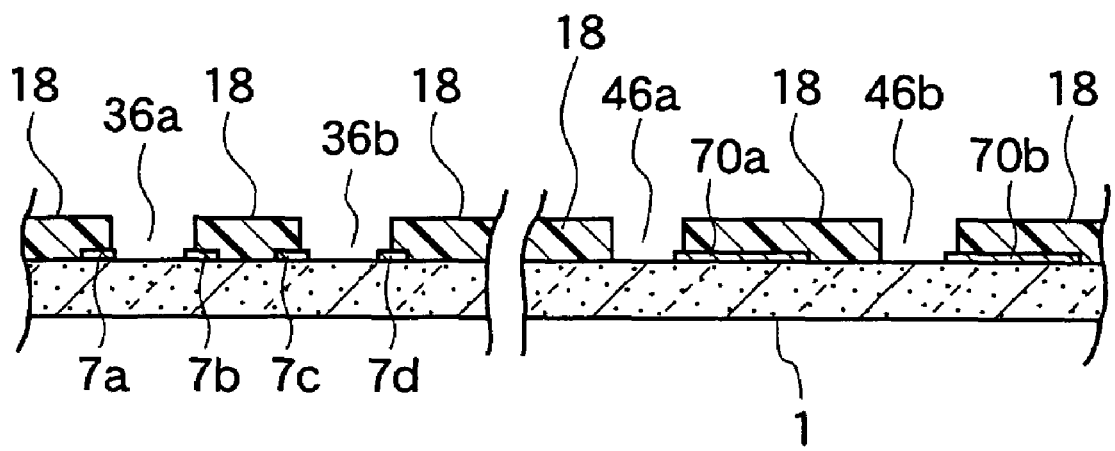
FIG. 17 is a third sectional view of the reticle depicting the manufacturing process in accordance with the embodiment of the present invention.
Figure 18:
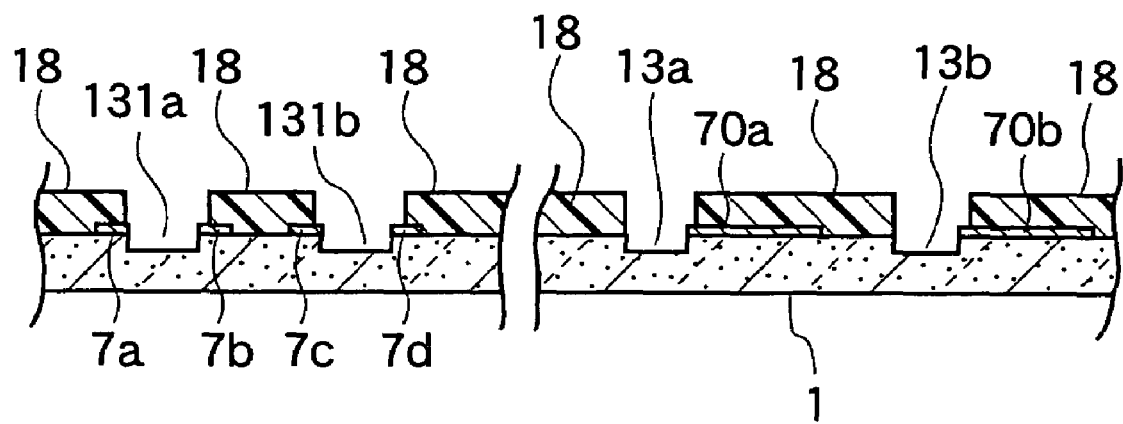
FIG. 18 is a fourth sectional view of the reticle depicting the manufacturing process in accordance with the embodiment of the present invention.

(c) A second resist film 18 is coated on the mask substrate 1 with spin coater. Afterward, as shown in FIG. 17, second openings 36a, 36b and second openings 46a, 46b are delineated using the photolithography process. The parts of the mask substrate 1 exhibited by the second openings 36a, 36b and the second openings 46a, 46b are selectively etched away with the anisotropic etching, using the second resist film 8 as a mask, and asymmetrical diffracting portions 131a, 131b, 13a, 13b are delineated as shown in FIG. 18. In this process, the asymmetrical diffracting portions 131a, 131b, 13a, 13b are delineated to a depth where the phase difference exposure laser light transmitted to the surface of the mask substrate 1 reaches 90 degrees.

Figure 19:
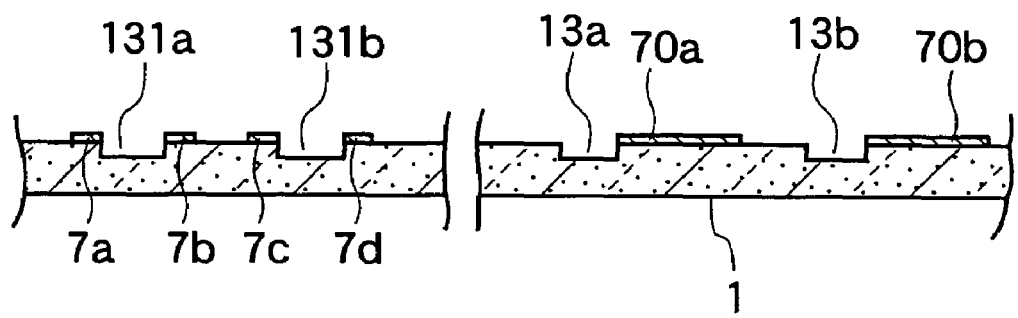
FIG. 19 is a fifth sectional view of the reticle depicting the manufacturing process in accordance with the embodiment of the present invention.
Figure 20:
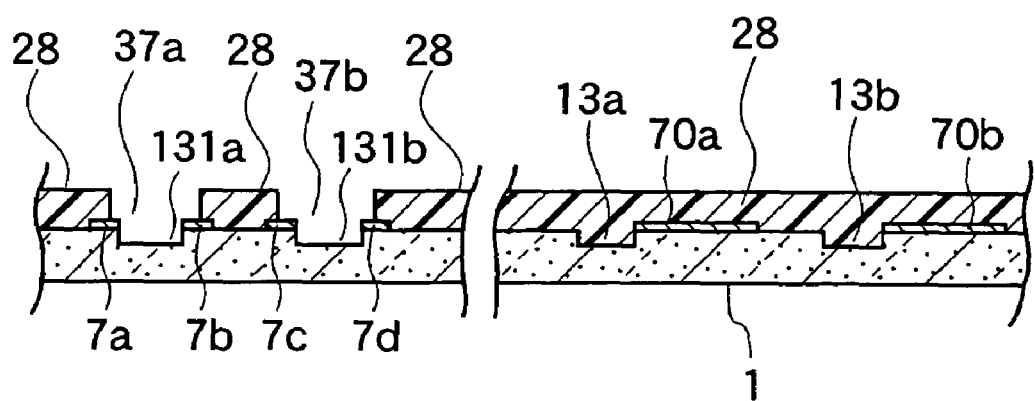
FIG. 20 is a sixth sectional view of the reticle depicting the manufacturing process in accordance with the embodiment of the present invention.

(d) As shown in FIG. 19, remove the second resist film 18 is removed with a removal agent. Afterward, the mask substrate 1 is coated with a third resist film 28 by the spin coater, and third openings 37a, 37b are delineated using the photolithography process, as shown in FIG. 20.

Figure 21:
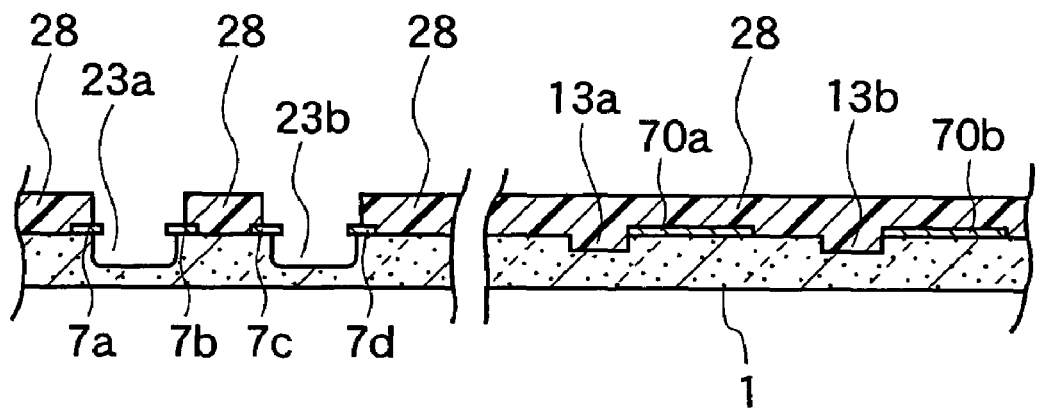
FIG. 21 is a seventh sectional view of the reticle depicting the manufacturing process in accordance with the embodiment of the present invention.

(e) Further the mask substrate 1 is selectively etched from the asymmetrical diffracting portions 131a, 131b exhibited by the third openings 37a, 37b with isotropic etching process, using the third resist film 28 as a mask, and symmetrical diffracting portions 23a, 23b are delineated. In this process, the symmetrical diffracting portions 23a, 23b are delineated to a depth where the phase difference of exposure laser light transmitted to the surface of the mask substrate 1 reaches 180 degrees. Although it is acceptable to further etch using the anisotropic etching process, but if the isotropic etching process is used for the etching in the sidewall direction, as shown in FIG. 21, dimensional precision of the projected image by the manufactured reticle is improved.

Figure 22:
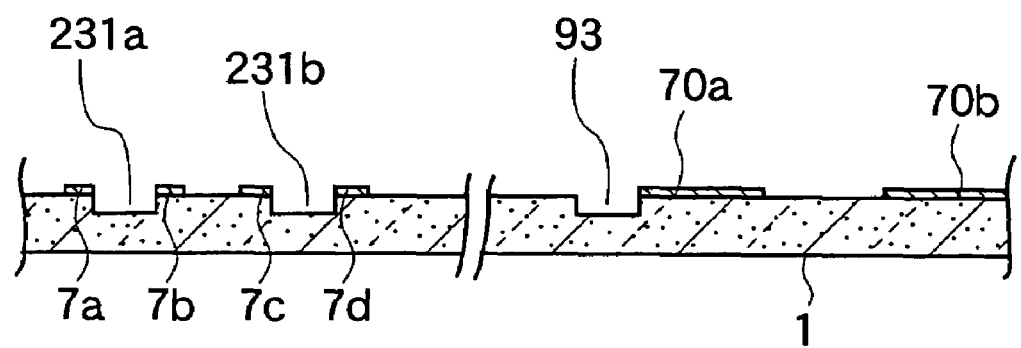
FIG. 22 is a eighth sectional view of the reticle depicting the manufacturing process in accordance with the embodiment of the present invention.

(f) Finally, the third resist film 28 is removed with a removal agent. As shown in FIG. 22, both the device pattern 15a that includes the light shielding masks 7a through 7d, and the symmetrical diffracting portions 23a, 23b, and the asymmetrical diffraction grating 22a that includes the light shielding bands 70a, 7b and the asymmetrical diffracting portions 13a, 13b are formed on the mask substrate 1. Thus completing the reticle according to the embodiment.

It has been difficult to establish both an asymmetrical diffracting portion and a diffracting portion having differing phases together on the same mask substrate. Therefore, it is necessary to prepare two masks, one for the test reticle that includes an asymmetrical diffraction grating, and one for the production reticle that includes a device pattern. However, on the manufacturing method put forth above, in the process shown from FIGS. 17 to 18, after each of the asymmetrical diffracting portions 131a, 131b, 13a, 13b have been delineated by an-isotropic etching to a depth at which phase difference of the exposure laser light transmitted to the surface of the mask substrate 1 reaches 90 degrees, the second resist film 18 still remaining after the an-isotropic etching is removed by a removal agent, in the process shown in FIG. 19. Next, as shown in FIG. 20, the third resist film 28 is formed, and the asymmetrical diffracting portions 131a, 131b are further etched with isotropic etching to a depth at which the phase difference of the exposure laser light transmitted to the surface of the mask substrate 1 reaches 180 degrees, and the symmetrical diffracting portions 23a, 23b are formed. According to such manufacturing method, it is possible to form both diffraction patterns having different exposure laser light phase differences, such as the device pattern and the asymmetrical diffraction grating, on the mask substrate 1 with a high level of precision. Also, the contrast of the projection image is improved if the resist is exposed with a reticle that possesses symmetrical diffracting portions that have been partly etched to the lower regions of the light shielding masks. As in the afore mentioned manufacturing method, if the mask substrate 1 is further etched from the asymmetrical diffracting portions 131a, 131b shown in FIG. 18 with isotropic etching after the asymmetrical diffracting portions 131a, 131b have been delineated with an-isotropic etching, it is possible to form the symmetrical diffracting portions 23a, 23b that have been partly etched to the lower regions of the light shielding masks 7b through 7e shown in FIG. 22, with a high level of precision.

(First Modification of the Embodiment)

Figure 23:
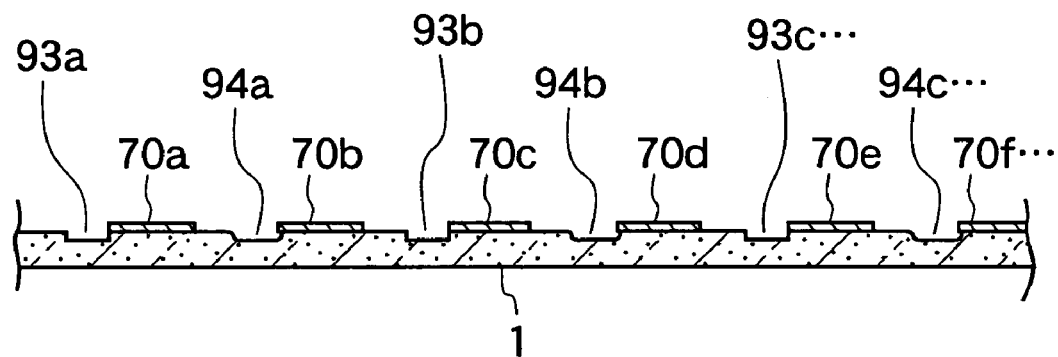
FIG. 23 is a sectional view of a reticle in accordance with a first modification of the embodiment of the present invention.

FIG. 23 is a cross section view of the asymmetrical diffraction grating of the reticle according to a first modification of the embodiment. Differing from the asymmetrical diffracting portions 13a, 13b, 13c shown in FIG. 5, asymmetrical diffracting portions 93a, 93b, 93c, . . . , and U-type asymmetrical diffracting portions 94a, 94b, 94c, . . . are established alternately. Other structural aspects are similar to those of the asymmetrical diffraction grating shown in FIG. 5 so description thereof is omitted.

Here the asymmetrical diffracting portions 93a, 93b, 93c, . . . , and the U-type asymmetrical diffracting portions 94a, 94b, 94c, . . . are all grooves established in the inside the mask substrate 1 near the surface, and are all delineated at a depth where the phase difference exposure laser light transmitted to the surface of the mask substrate 1 reaches 105 degrees. The U-type asymmetrical diffracting portions 94a, 94b, 94c, . . . are all delineated at a depth where the phase difference exposure laser light transmitted to the surface of the mask substrate 1 reaches 75 degrees. For instance, the mask substrate 1 is composed of a substance such as fused silica glass for instance, which possesses a refraction index of 1.56, and in a case exposing with an argon fluoride (ArF) excimer laser having a wavelength of 193 nm, the asymmetrical diffracting portions 93a, 93b, 93c, . . . , all have depths of 100.5 nm, the U-type asymmetrical diffracting portions 94a, 94b, 94c, . . . , all have depths of 71.8 nm. It is possible to inspect the optical system 140 shown in FIG. 1 using the apparatus for monitoring optical system shown in FIG. 9 and the method for monitoring the optical system shown in FIGS. 10 and 11 even in instances of exposure using a reduction projection exposure device shown in FIG. 1 having a reticle 5 that includes an asymmetrical diffraction grating shown in FIG. 23, because the optical axis intersecting points of the wafer 31 and the projection image positions of the asymmetrical diffraction grating possess a linear relationship.

Next, a method for manufacturing the reticle that includes the asymmetrical diffraction grating shown in FIG. 3 will be described using the FIGS. 24 through 28.

Figure 24:
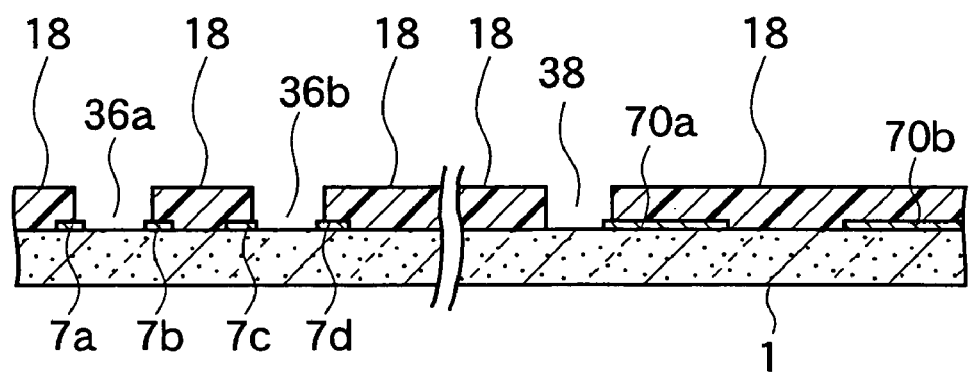
FIG. 24 is a first sectional view of the reticle depicting. the manufacturing process in accordance with the first modification of the embodiment of the present invention.

(a) The light shielding masks 7a through 7d and light shielding bands 70a, 70b on the surface of the mask substrate 1 are formed using the method put forth in FIGS. 15 and 16. Further, the second resist film 18, which possesses each of second openings 36a, 36b, and a second opening 38, are formed on the surface of the mask substrate 1, as shown in FIG. 24. The mask substrate 1 is composed of a substance such as fused silica glass, and the light shielding masks and bands are composed of a substance such as chromium.

Figure 25:
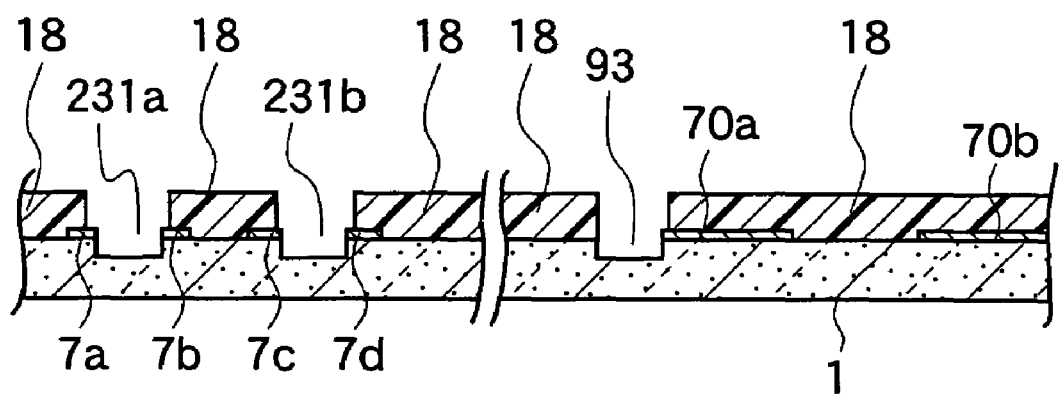
FIG. 25 is a second sectional view of the reticle depicting the manufacturing process in accordance with the first modification of the embodiment of the present invention.

(b) The sections of mask substrate 1 that are exhibited by the second openings 36a, 36b, 38 are selectively etched with anisotropic etching, then each of asymmetrical diffracting portions 231a, 231b, 93 are delineated as shown in FIG. 25. Each of the asymmetrical diffracting portions 231a, 231b, 93 are delineated to a depth at that the phase difference of the exposure laser light transmitted to the surface of the mask substrate 1 reaches 105 degrees.

Figure 26:
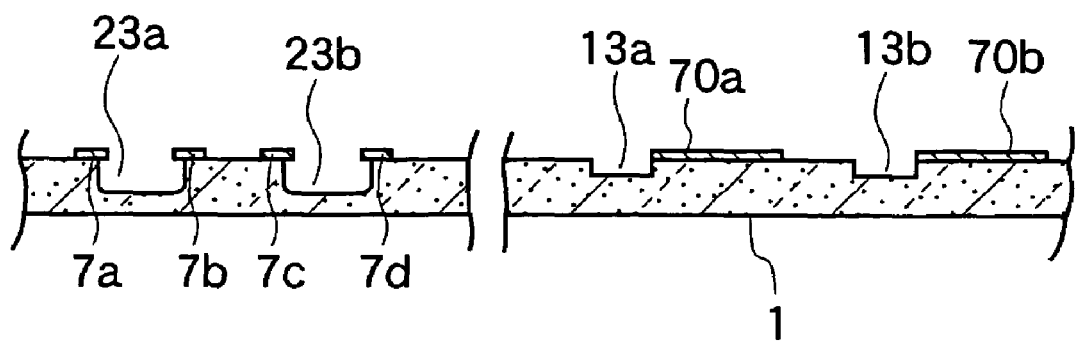
FIG. 26 is a third sectional view of the reticle depicting the manufacturing process in accordance with the first modification of the embodiment of the present invention.
Figure 27:
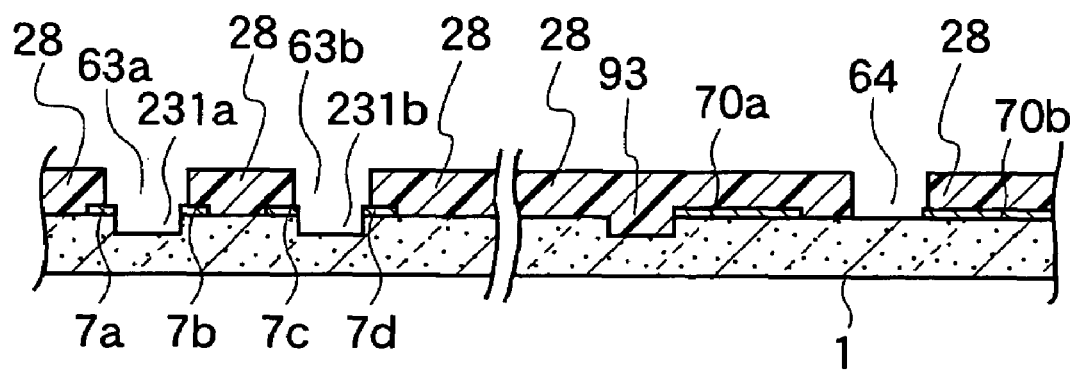
FIG. 27 is a fourth sectional view of the reticle depicting the manufacturing process in accordance with the first modification of the embodiment of the present invention.

(c) After removing the second resist film 18 with a removal agent as shown in FIG. 26, and the third resist film 28 is coated onto the surface of the mask substrate 1 by the spin coater, as shown in FIG. 27. Third openings 63a, 63b, and a third opening 64 are delineated using the photolithography process.

Figure 28:
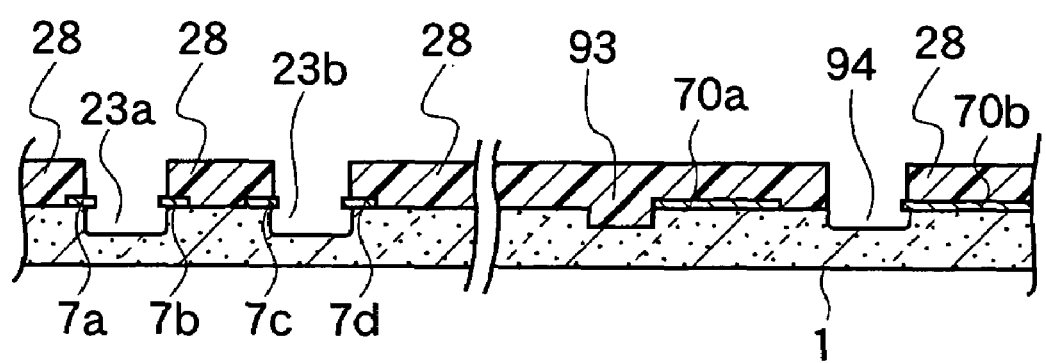
FIG. 28 is a fifth sectional view of the reticle depicting the manufacturing process in accordance with the first modification of the embodiment of the present invention.

(d) The sections of mask substrate 1 that are exhibited by the third openings 63a, 63b, 64 are selectively etched with isotropic etching. Consequently, each of the symmetrical diffracting portions 23a, 23b, and the asymmetrical diffracting portion 94 are delineated as shown in FIG. 28. In this process, each of the symmetrical diffracting portions 23a, 23b are delineated to a depth at that the phase difference of the exposure laser light transmitted to the surface of the mask substrate 1 reaches 180 degrees, and the asymmetrical diffracting portion 94 is delineated to a depth at that the phase difference of the exposure laser light transmitted to the surface of the mask substrate 1 reaches 75 degrees.

Figure 29:
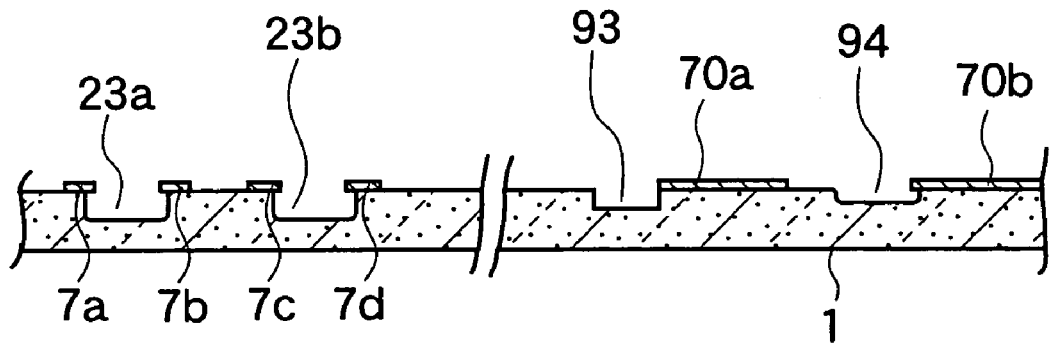
FIG. 29 is a sixth sectional view of the reticle depicting the manufacturing process in accordance with the first modification of the embodiment of the present invention.

(e) Finally, the third resist film 28 is removed with a removal agent, thus completing the reticle that includes both the device patterns and the asymmetrical diffraction grating established on the surface of the mask substrate 1, as shown in FIG. 29. The device patterns include light shielding masks 7a through 7d and symmetrical diffracting portions 23a and 23b. The asymmetrical diffraction grating includes the asymmetrical diffracting portions 93, 94 and the light shielding band 70a, 70b (Second Modification of the Embodiment)

Figure 30:
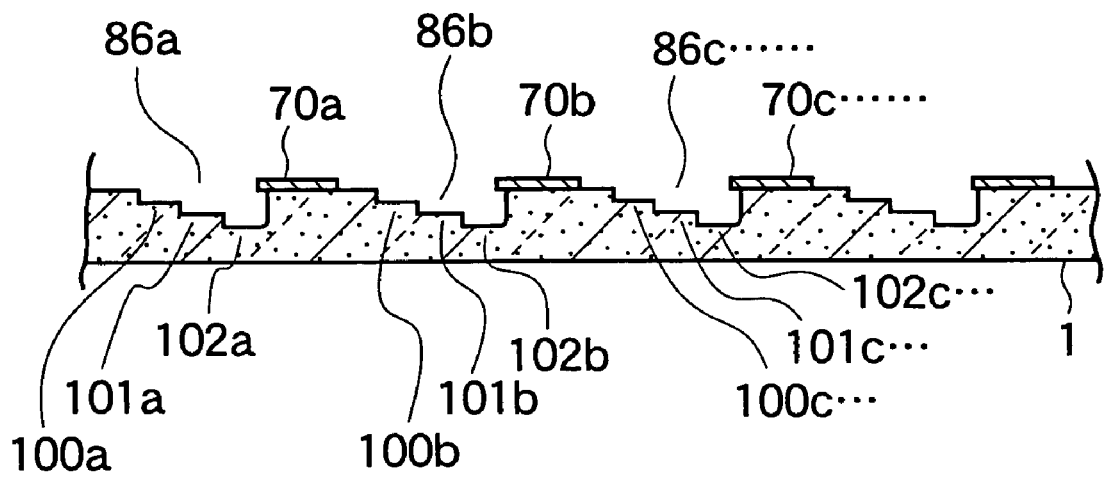
FIG. 30 is a sectional view of a reticle in accordance with a second modification of the embodiment of the present invention.

FIG. 30 is a cross sectional view of the asymmetrical diffraction grating of the reticle according to a second modification of the embodiment of the present invention. Unlike the asymmetrical diffracting portions 13a, 13b, 13c, . . . shown in FIG. 5, staircase diffracting portions 86a, 86b, 86c, are established. Each of the staircase diffracting portions 86a, 86b, 86c, . . . includes a section that descends in a staircase-like fashion. Other structural aspects are similar to the asymmetrical diffraction grating shown in FIG. 5 so description thereof is omitted.

Here, the step-like regions of the staircase diffracting portion 86a include a phase difference transparent face 100a, phase difference transparent face 101a, and a equiphase transparent face 102a. The phase difference transparent face 100a is disposed at a depth where the phase difference of the exposure laser light transmitted to the surface of the mask substrate 1 reaches 60 degrees, the phase difference transparent face 101a is disposed at a depth where the phase difference of the exposure laser light transmitted to the surface of the mask substrate 1 reaches 120 degrees, and the equiphase transparent face 102a is disposed at a depth where the phase difference of the exposure laser light transmitted to the surface of the mask substrate 1 reaches 180 degrees. Therefore, in an instance exposing with an argon fluoride (ArF) excimer laser having a wavelength of 193 nm, the phase difference transparent face 100a is disposed in a depth of 57.4 nm, the phase difference transparent face 101a is disposed in a depth of 114.9 nm, and the equiphase transparent face 102a is disposed in a depth of 172.3 nm, from the surface of the mask substrate 1, which is composed of fused silica glass and has a refraction index of 1.56. The other staircase diffracting portions 86b, 86c, . . . , each identical in arrangement, possess the phase difference transparent faces 100b, 100c, . . . , phase difference transparent faces 101b, 100c, . . . , and equiphase transparent faces 102b, 102c, . . . It is possible to inspect the optical system shown in FIG. 1 using the apparatus for monitoring optical system shown in FIG. 9 or the method for monitoring the optical system shown in FIGS. 10 and 11 even in instances exposing by furnishing the reduced projection exposure device shown in FIG. 1 with the reticle 5 that includes the asymmetrical diffraction grating shown in FIG. 30, because of the linear relationship that the optical axis intersecting points of the wafer 31 and the projection image positions of the asymmetrical diffraction grating possess.

Next, a method for manufacturing the reticle that includes the asymmetrical diffraction grating shown in FIG. 30 will be described using FIGS. 31 through 35.

Figure 31:
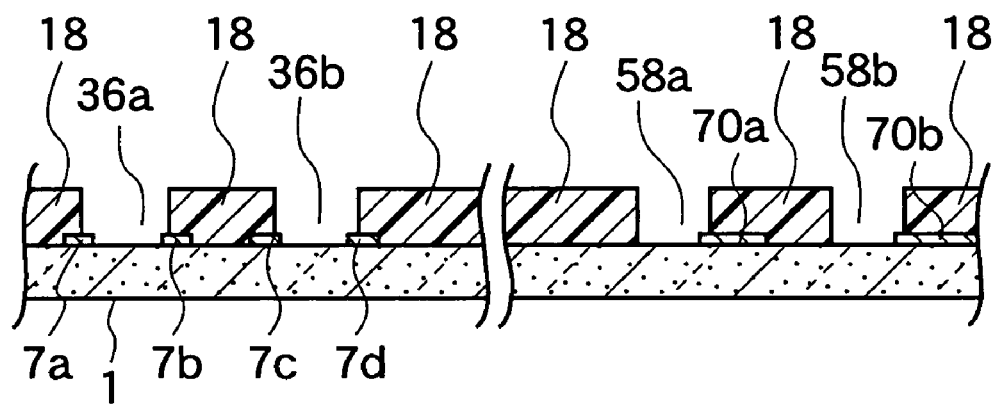
FIG. 31 is a first sectional view of the reticle depicting the manufacturing process in accordance with the second modification of the embodiment of the present invention.

(a) With the manufacturing method appearing in FIGS. 15 through 17, the light shielding masks 7a through 7d, the light shielding bands 70a, 70b, and the second resist film 18 having second openings 36a, 36b, and second openings 58a, 58b are formed as shown in FIG. 31.

Figure 32:
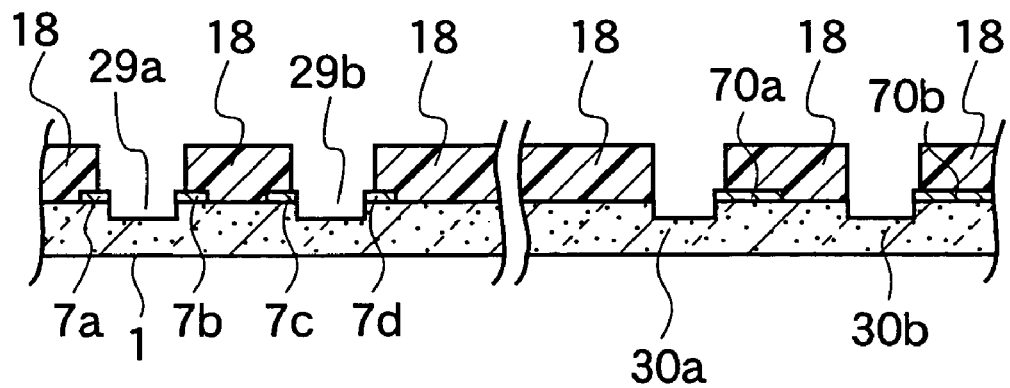
FIG. 32 is a second sectional view of the reticle depicting the manufacturing process in accordance with the second modification of the embodiment of the present invention.
Figure 33:
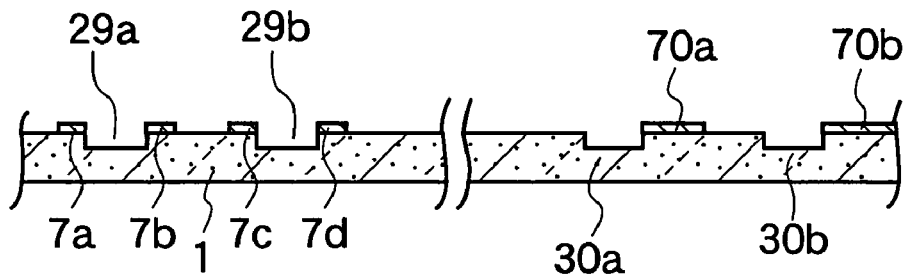
FIG. 33 is a third sectional view of the reticle depicting the manufacturing process in accordance with the second modification of the embodiment of the present invention.
Figure 34:
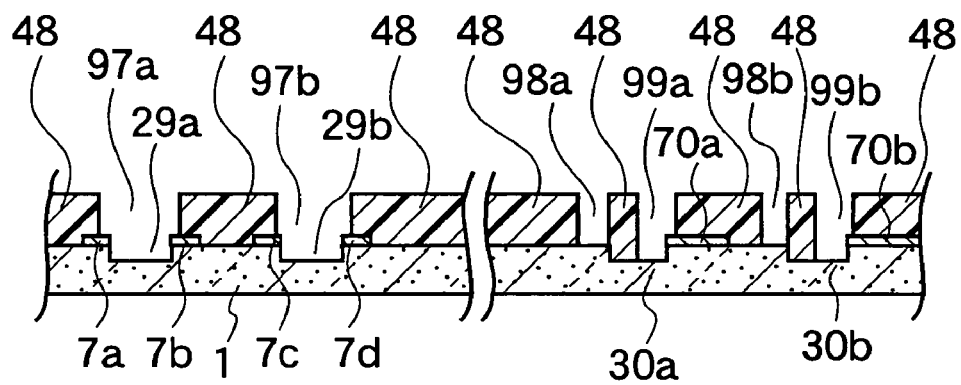
FIG. 34 is a fourth sectional view of the reticle depicting the manufacturing process in accordance with the second modification of the embodiment of the present invention.

(b) The sections of mask substrate 1 that are exhibited by the second openings 36a, 36b, 58a, 58b are selectively etched with anisotropic etching, then the asymmetrical diffracting portions 29a, 29b, 30a, 30b are delineated as shown in FIG. 32. The asymmetrical diffracting portions 29a, 29b, 30a, 30b are delineated to a depth at which the phase difference of the exposure laser light transmitted to the surface of the mask substrate 1 reaches 120 degrees.

(c) After using a removal agent to remove the second resist film 18, the third resist film 48 coated onto the surface of the mask substrate 1 by the spin coater, and third openings 97a, 97b, 98a, 98b, 99a, 99b are delineated.

Figure 35:
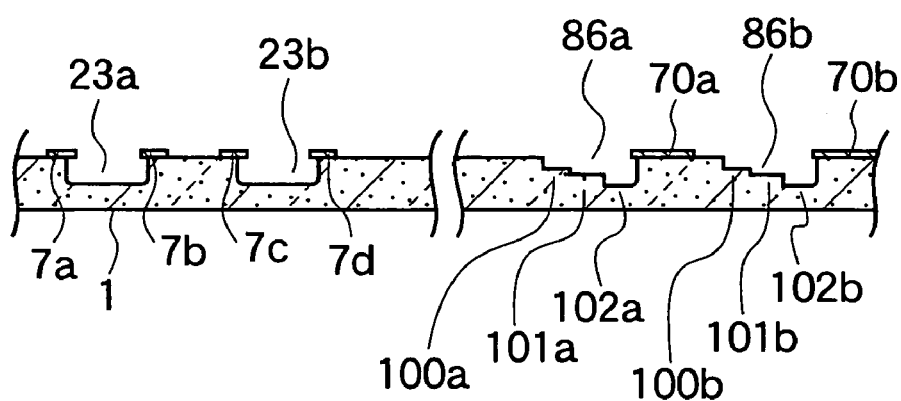
FIG. 35 is a fifth sectional view of the reticle depicting the manufacturing process in accordance with the second modification of the embodiment of the present invention.

(d) Finally, after selectively etching the sections of mask substrate 1 that are exhibited by the third openings 97a, 97b, 98a, 98b, 99a, 99b with isotropic etching, the third resist film 48 is removed by using the removal agent. Thus, fabrication of the reticle that includes a device pattern and an asymmetrical diffraction grating on the mask substrate 1 is completed, as shown in FIG. 35. The device pattern includes the light shielding masks 7a through 7d and the symmetrical diffracting portions 23a, 23b. The asymmetrical diffraction grating includes the light shielding bands 70a, 70b and staircase diffracting portions 86a, 86b.

(Third Modification of the Embodiment)

The reduction projection exposure device according to a third modification of the embodiment adds to the structural aspects of the reduction projection exposure device shown in FIG. 12 by including a inspection optical system having a inspecting laser oscillator 65a, a reflection mirror 68a, a beam splitter 67a, and a TTL sensor 66a. The reflection mirror 68a guides the laser emitted by the inspecting laser oscillator 65a to the test pattern 20a and alignment mark 26a of the reticle 5. The beam splitter 67a is disposed below the reticle 5 and splits the emitted laser light. The TTL sensor 66a receives the laser light split by the beam splitter 67a.

The laser emitted from the inspecting laser oscillator 65a has a wavelength that is outside of the sensitivity range of the resist coating on the wafer 31, it is guided by the reflection mirror 68a to the test pattern 20a and alignment mark 26a of the reticle. The laser transmitted through the test pattern 20a and alignment mark 26a passes through the beam splitter 67a and the projection optical system 42 and is irradiated upon the surface of the wafer 31. The projected images of the test pattern 20a and the alignment mark 26a on the surface of the wafer 31 pass through the projection optical system 42 and the beam splitter 67a and are sensed by the TTL sensor 66a.

In the same manner, a inspecting optical system including a inspecting laser oscillator 65b, a reflection mirror 68b, a beam splitter 67b, and a TTL sensor 66b is disposed for the test pattern 20b and the alignment mark 26b as well. Likewise, a inspecting optical system including a inspecting laser oscillator 65c, a reflection mirror 68c, a beam splitter 67c, and a TTL sensor 66c is disposed for the test pattern 20c and the alignment mark 26c as well. Other structural aspects are similar to those of the reduction projection exposure device shown in FIG. 1 so description thereof is omitted.

Figure 36:
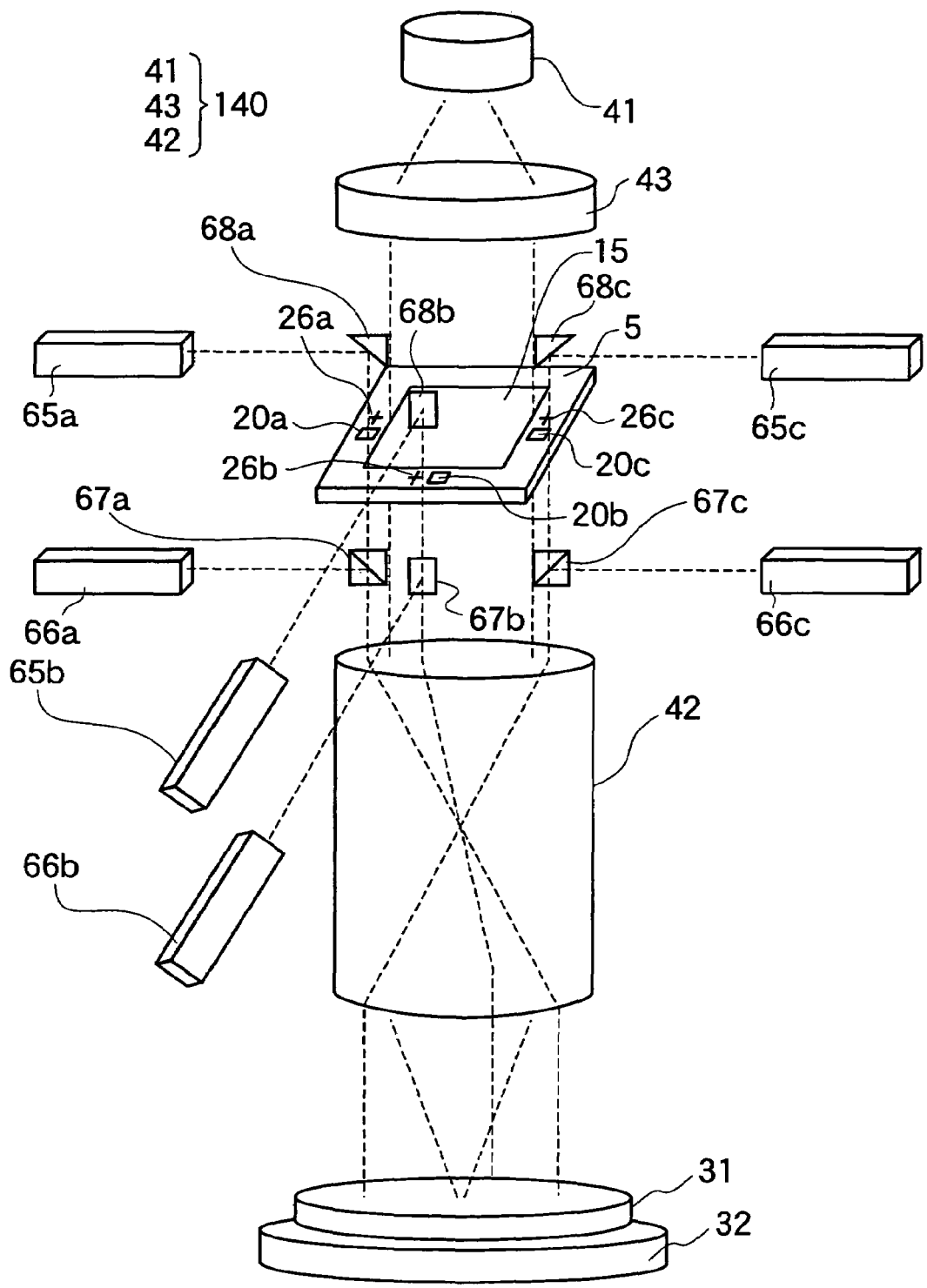
FIG. 36 is an exploded perspective view of a reduction projection exposure device in accordance with a third modification of the embodiment of the present invention.

If the reticle 5 and the inspecting optical system are used in this manner, it becomes possible to observe each of the projection images of the test patterns 20a, 20b, 20c while the wafer 31 is disposed on the reduction projection exposure device. This is because it is unnecessary to develop the wafer 31 after exposure in order to carry out observation of the test patterns 20a, 20b, 20c. Therefore it becomes possible to inspect and correct the optical system 140 of the reduction projection exposure device shown in FIG. 36 using the apparatus for monitoring optical system shown in FIG. 9 and the method for monitoring the optical system shown in FIGS. 10 and 11, without having to exchange the wafer 31. Also, because the alignment marks 26a, 26b, 26c are each established adjacent one of the test patterns 20a, 20b, 20c, it is possible to simultaneously align the positioning of the horizontal plane of the wafer 31.

(Fourth Modification of the Embodiment)

Figure 37:
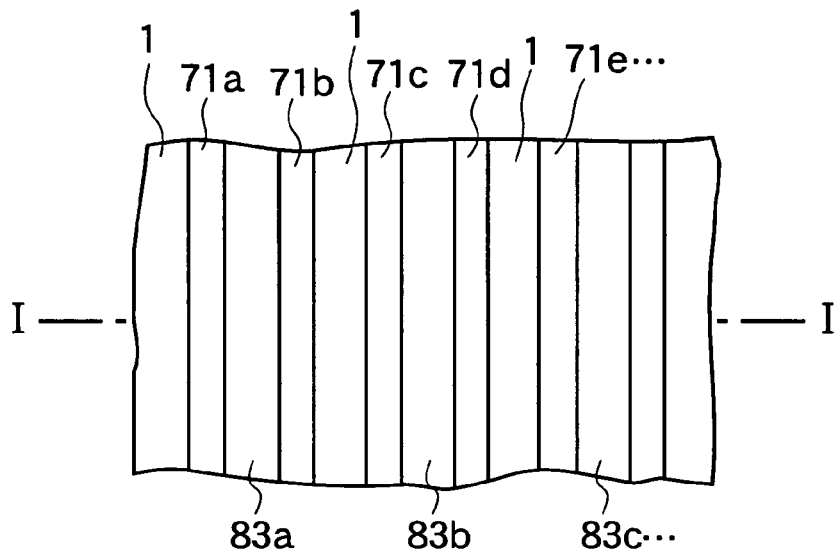
FIG. 37 is a plan view of an asymmetrical diffraction grating of the test pattern in accordance with a fourth modification of the embodiment of the present invention.
Figure 38:
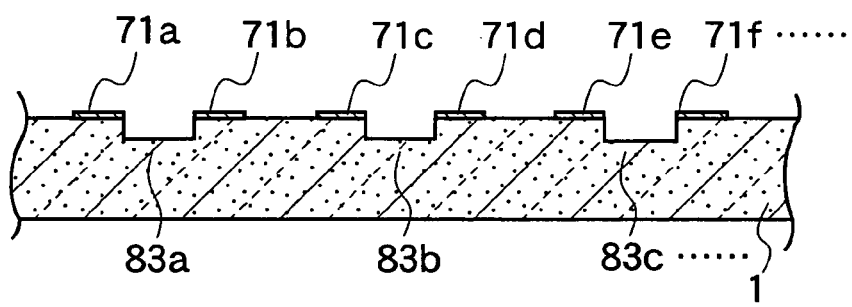
FIG. 38 is a sectional view of the asymmetrical diffraction grating in accordance with the fourth modification of the embodiment of the present invention.

FIG. 37 is a plan view of the asymmetrical diffraction grating of the reticle according to a fourth modification of the embodiment, FIG. 38 is a cross sectional view from the I-I line in FIG. 37. The asymmetrical diffraction grating according to the fourth modification of the embodiment includes light shielding bands 71a, 71b, 71c, 71d, 71e, 71f, . . . , that all sandwich in each of asymmetrical diffracting portions 83a, 83b, 83c, . . . as shown in FIGS. 37 and 38.

The asymmetrical diffracting portions 83a, 83b, 83c, . . . here are all grooves established inside of the mask substrate 1 near the top surface, at a depth where the phase difference of the exposure laser light transmitted to the surface of the mask substrate 1 is a multiple of value that is greater than 0 degrees and less than 180 degrees. For instance, the asymmetrical diffracting portions 83a, 83b, 83c, . . . , are established at a depth at which the phase difference of the exposure laser light transmitted to the surface of the mask substrate 1 reaches 90 degrees. The constitution of the reticle according to the fourth modification of the embodiment, which includes an asymmetrical diffraction grating in this manner, is identical to the reticle 5 shown in FIG. 2 and so description thereof is omitted.

The following instance is introduced for the sake of description: the reticle 5 that includes the asymmetrical diffraction grating shown in FIGS. 37 and 38 is disposed on the reduction projection exposure device shown in FIG. 1. A wafer 31 composed of a silicon substrate and coated with a resist film is exposed with an argon fluoride (ArF) excimer laser having a wavelength of 193 nm, and subsequently developed. The projection image of the above mentioned asymmetrical diffraction grating includes light shielding band projection images 104a, 104b, 104c, 104d, 104e, 104f, substrate surface projection images 95a, 95b, 95c, . . . , and asymmetrical diffracting portion projection images 96a, 96b, 96c, . . . The light shielding band projection images 104a, 104b, 104c, 104d, 104e, 104f belong to the light shielding bands 71a, 71b, 71c, 71d, 71e, 71f, . . . , and are disposed in a way as to be sandwiched by the substrate surface projection images 95a, 95b, 95c, . . . , which belong to the surface of the mask substrate 1. The asymmetrical diffracting portion projection images 96a, 96b, 96c, . . . , belong to the asymmetrical diffracting portions 83a, 83b, 83c, In observing the projection images shown in FIG. 39 under the SEM, the AFM or the like, the attained light shielding band projection images 104a, 104b, 104c, 104d, 104e, 104f have a width represented by L, the substrate surface projection images 95a, 95b, 95c, . . . , have a width represented by S1, and the asymmetrical diffracting portion projection images 96a, 96b, 96c, . . . , have a width represented by S2. In this instance, there are two conditions which express the amount of exposure: exposure A, and an exposure B, which has 1.5 times the intensity of the exposure A. FIG. 40 is a graph plotting the measurement of L+S2 when the wafer stage 32 of the reduction projection exposure device shown in FIG. 1 is moved in the optical axis direction under the two exposure amount conditions A and B.

Figure 40:
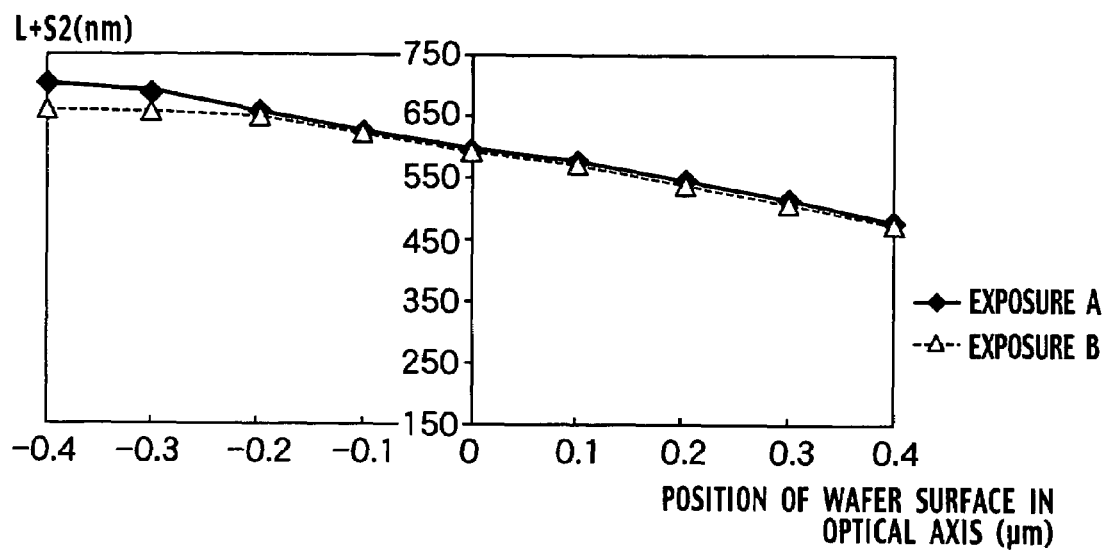
FIG. 40 is a first sample graph of optical-axis-intersecting point versus line width in accordance with the fourth modification of the embodiment of the present invention.
Figure 41:
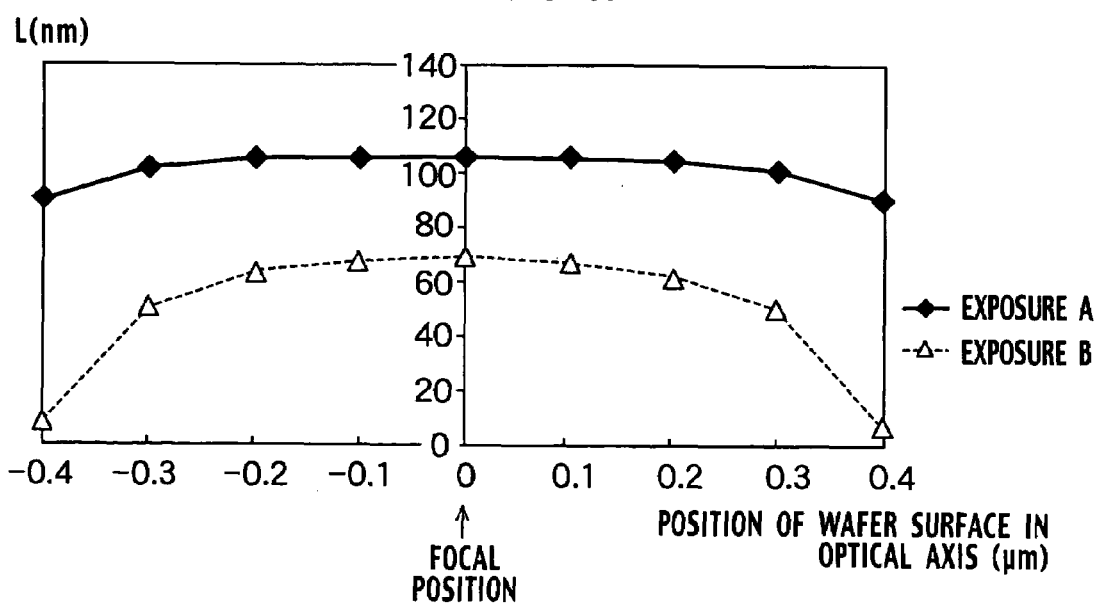
FIG. 41 is a second sample graph of optical-axis-intersecting point versus line width in accordance with the fourth modification of the embodiment of the present invention.

There is a substantially linear relationship between the amount of change in the length of L+S2 and the amount of the movement of the wafer 31 toward the optical axis, as shown in FIG. 40. Also, the value of the length of L+S2 undergoes no real change for the most part in switching the exposure from A to B. On one hand, as shown in FIG. 41, the length of L alone does not change very much in the fixed exposure condition of when the wafer 31 is moved from the focal point to −200 nm to +200 nm. However, the length of L does show some change when the wafer 31 is in a fixed position and the exposure is changed from A to B.

As shown above, if the wafer 31 is exposed with the reduction projection exposure device shown in FIG. 1 having the reticle 5 that includes the asymmetrical diffraction grating shown in FIGS. 37 to 38, it becomes possible to calculate how much the wafer 31 has deviated from the focal point in the direction of the optical axis, without depending on the exposure amount. This becomes possible by observing the projection image of the wafer 31. Furthermore, detection is even possible in instances where there occurs a change in the exposure amount on a reduction projection exposure device as shown in FIG. 41.

Figure 42:
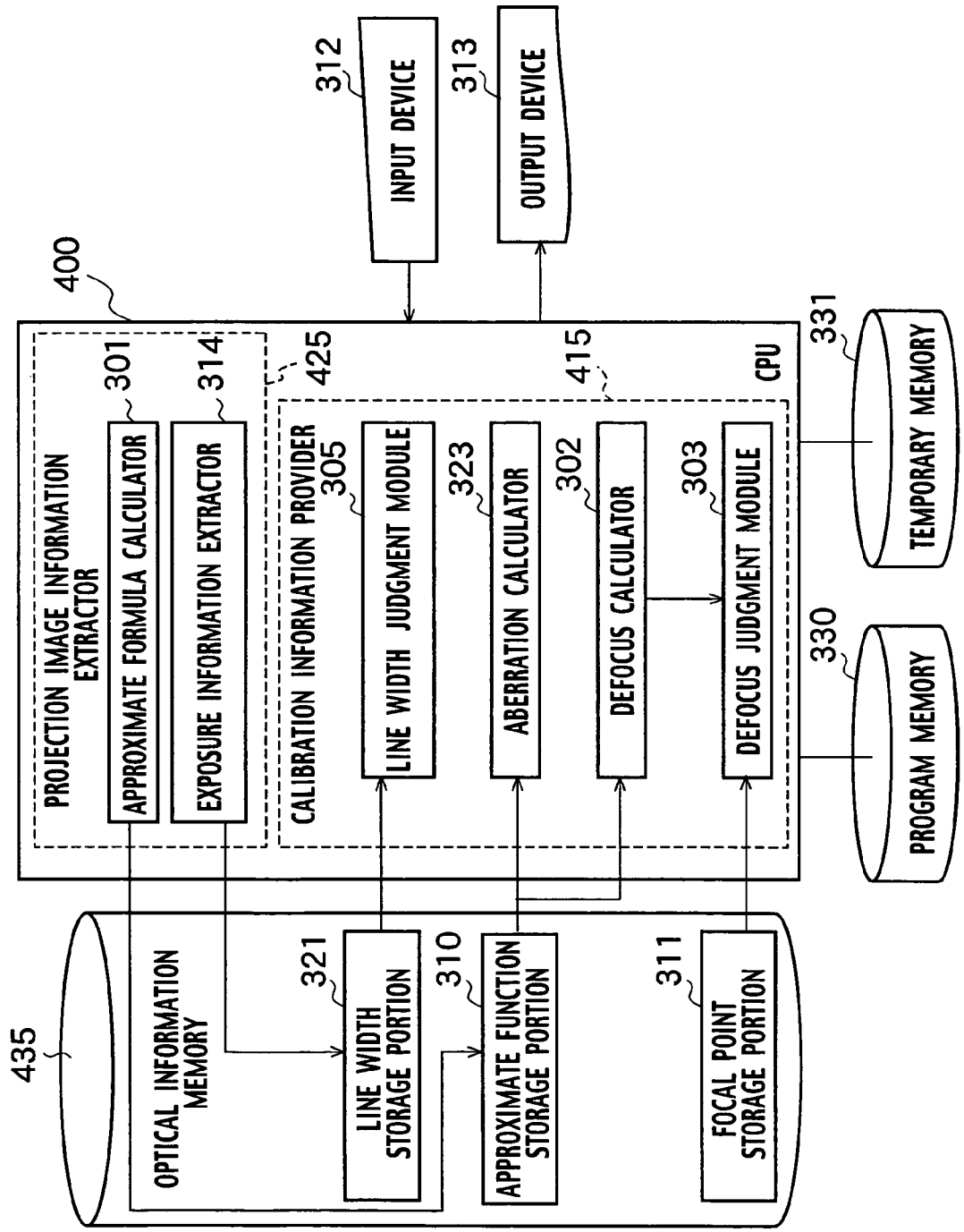
FIG. 42 is a block diagram of an apparatus for monitoring optical system in accordance with the fourth modification of the embodiment of the present invention.

Next, an apparatus for monitoring optical system according to the fourth modification of the embodiment is shown in FIG. 42. The part of a CPU 400 that differs with the CPU 300 of the apparatus for monitoring optical system shown in FIG. 9 is that the CPU 400 further includes an exposure information extractor 314. And different from the optical system corrector 315, an optical system corrector 415 further includes a line width judgment module 305. An optical information memory 435 differs from the optical information memory 335 by further including a line width storage portion 321. Other structural aspects are identical to those of the apparatus for monitoring optical system shown in FIG. 9 and so description thereof is omitted.

Figure 39:
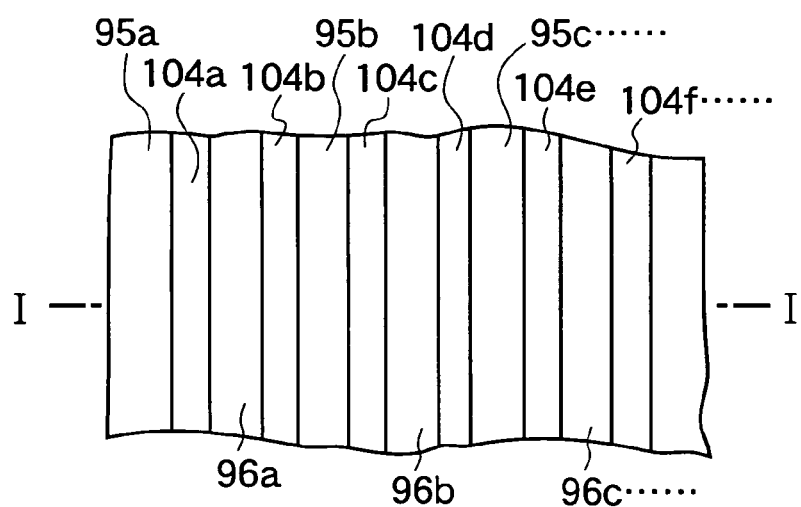
FIG. 39 is a plan view of a projected image of the asymmetrical diffraction grating in accordance with the fourth modification of the embodiment of the present invention.

Here the exposure information extractor 314 extracts a line width L of the light shielding band projection images 104a, 104b, 104c, 104d, 104e, 104f at the optimum exposure amount as the optimum line width value of L, from image information of a projection image shown in FIG. 39. The line width storage portion 321 stores the optimum line width value of L extracted by the exposure information extractor 314. The line width judgment module 305 compares the optimum line width value with the actual measured values of the line width of L that is measured at the wafer to be inspected and input by the input device 312. The line width judgment module 305 then judges whether or not a change of the exposure has occurred on the reduction projection exposure device shown in FIG. 1.

By disposing the reticle 5 includes an asymmetrical diffraction grating shown in FIGS. 37 and 38 on the reduction projection exposure device shown in FIG. 1, and using the apparatus for monitoring optical system shown in FIG. 42, it becomes possible to inspect for aberration and focal point deviation on the optical system 140, and it also becomes possible to inspect for changes in the exposure.

Next, a method for monitoring the optical system so as to inspect the changes in the exposure of the exposure device shown in FIG. 1 using FIGS. 1, 39, 42, 43.

Figure 43:
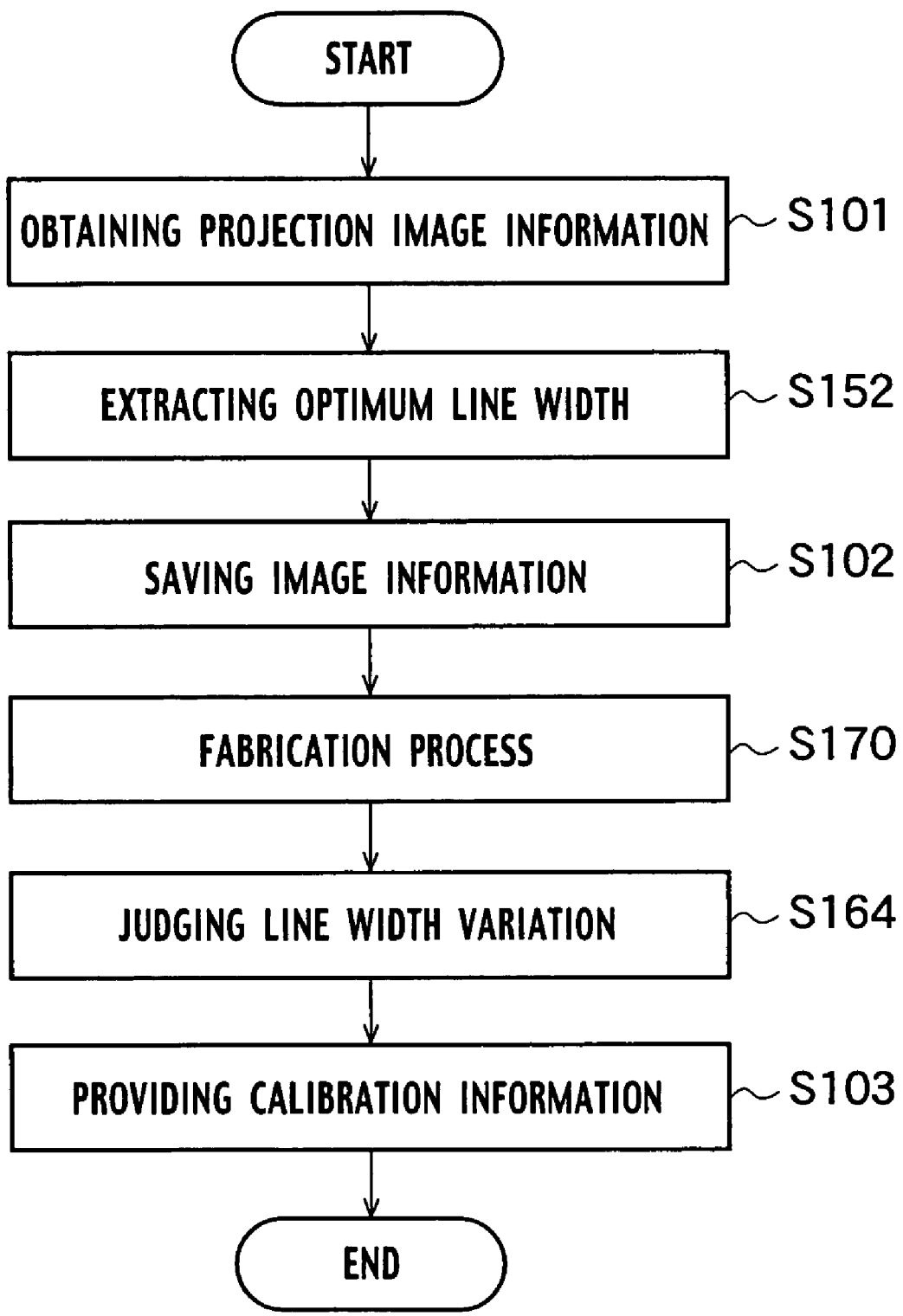
FIG. 43 is a flowchart depicting a method for monitoring the optical system in accordance with the fourth modification of the embodiment of the present invention.

(a) In a step S101 on FIG. 43, the wafer 31 is exposed with the reduction projection exposure device shown in FIG. 1 and the reticle 5 having the test patterns 20a through 20c at the optimum exposure. After exposing and developing the wafer 31, image information of the projection image of the wafer 31 as shown in FIG. 39 observed under the SEM, or the AFM is input from the input device 312 shown in FIG. 42 to the projection image information extractor 425.

(b) In a step S152 of FIG. 43, the exposure information extractor 314 of the projection image information extractor 425 shown in FIG. 42 extracts the line widths of the light shielding band projection images 104a, 104b, 104c, 104d, 104e, 104f shown in FIG. 39 as the optimum line width value, from the image information.

(c) In a step S102 of FIG. 43, the optimum line width value extracted in the step S152 is stored in the line width storage portion 321 shown in FIG. 42 along with the information of the optical axis intersecting points of the wafer 31. In a step S170, the production of semiconductor integrated circuitry begins at the reduction projection exposure device shown in FIG. 1.

(d) In the step S170, after semiconductor integrated circuitry has been produces on several lots, the optimum line width value stored by the line width storage portion 321 and the actual measured values of the line width input by the input device 312 are stored away at the line width judgment module 305 in a step S164 shown in FIG. 43. The line width judgment module 305 compares the optimum line width value and the actual measured values of the line width, and calculates the change in the line width. In a step S103, the calibration information provider 315 transmits the calculated change in the line width to the output device 313, thus ending the test.

As shown above, the reticle 5 includes asymmetrical diffraction gratings shown in FIGS. 37 and 38, and is disposed on the reduction projection exposure device shown in FIG. 1. If the method for monitoring the optical system shown in FIG. 43, and the apparatus for monitoring optical system shown in FIG. 42 are used, it becomes possible to inspect whether or not there occurs a change in the exposure on the reduction projection exposure device shown in FIG. 1, on a semiconductor integrated circuit production process. For instance, by observing the projection images of an asymmetrical diffraction grating as shown in FIG. 39 at the beginning and the end of a semiconductor integrated circuit production process, it becomes possible to recognize a decrease in the exposure on the reduction projection exposure device shown in FIG. 1, if the line width L of the light shielding band projection images 104a, 104b, 104c, 104d, 104e, 104f is observed to have increased.

Therefore, it becomes possible to focus in on problems occurring with the reduction projection exposure device's exposure as a countermeasure. It also becomes possible to shorten maintenance-checking time that is used to preserve quality standards. Also, it is possible to establish the asymmetrical diffraction grating according to the fourth modification of the embodiment shown in FIGS. 37 and 38 on the same mask substrate as both the device pattern and test pattern, as shown in FIG. 2. This makes it unnecessary to exchange from the production reticle to the test reticle that has been employed conventionally as maintenance.

Accordingly, if the production yield rates worsen, the wafer 31 can be tested right where it is according to the methods shown in FIGS. 10, 11, and 43. It becomes possible to clearly verify whether or not aberration is occurring on the optical system 140 of the reduction projection exposure device shown in FIG. 1, whether or not the wafer 31 is disposed in a spot deviating from the focal point, or whether or not the exposure of the optical system 140 is falling. Further, aside from optical based observation methods that might be used to observe the projection image of the test pattern shown in FIG. 39, if the observation is limited to using the SEM, or the AFM, it becomes possible to reduce the size of the test pattern region on the reticle shown in FIGS. 37 and 38.

(Other Embodiments)

Although the invention has been described above by reference to the embodiment of the present invention, the present invention is not limited to the embodiment described above. Modifications and variations of the embodiment described above will occur to those skilled in the art, in the light of the above teachings.

For example, it is possible to inspect whether the wafer is located on the focal point by measuring the difference between the line widths Si of the substrate surface projection images 95a, 95b, 95c, . . . and the line widths S2 of the asymmetrical diffracting portion projection images 96a, 96b, 96c, . . . shown in FIG. 39.

As described above, the present invention includes many variations of embodiments. Therefore, the scope of the invention is defined with reference to the following claims.

What is claimed is:

1. A reticle comprising:
   a mask substrate;
   a test pattern established on the mask substrate having an asymmetrical diffraction grating so as to generate positive first order diffracting light and negative first order diffracting light in different diffraction efficiencies; and
   a device pattern adjacent to the test pattern established on the mask substrate.

2. The reticle of claim 1, wherein the asymmetrical diffraction grating comprises:
   a plurality of light shielding bands disposed on the mask substrate; and
   a plurality of asymmetrical diffracting portions adjacent to the light shielding bands established on the mask substrate so as to generate phase difference of light reaching a multiple of value that is larger than 0 degrees and lower than 180 degrees.

3. The reticle of claim 1, wherein the asymmetrical diffraction grating comprises:
   a plurality of light shielding bands disposed on the mask substrate; and
   a plurality of staircase diffracting portions adjacent to the light shielding bands established on the mask substrate.

4. The reticle of claim 3, wherein each of the staircase diffracting portions comprises:
   a plurality of equiphase transparent face disposed at a depth where the phase difference of light reaches a multiple of 180 degrees in the mask substrate; and
   a plurality of phase difference transparent face disposed at a depth where the phase difference of the light reaches a multiple of value that is larger than 0 degrees and lower than 180 degrees in the mask substrate.

5. The reticle of claim 1, wherein the asymmetrical diffraction grating comprises:
   a plurality of asymmetrical diffracting portions established on the mask substrate so as to generate phase difference of light that reaches a multiple of value that is larger than 0 degrees and lower than 180 degrees; and
   a plurality of light shielding bands disposed on both side of the asymmetrical diffracting portions.

6. The reticle of claim 1, wherein the device pattern comprises:
   a plurality of symmetrical diffracting portions established on the mask substrate so as to generate phase difference of light that reaches a multiple of 180 degrees; and
   a plurality of light shielding masks disposed on both side of the symmetrical diffracting portions.

7. A method for manufacturing a reticle comprising:
   depositing a light shielding film on a mask substrate;
   coating a first resist film on the light shielding film and delineating first openings in the first resist film;
   etching the light shielding film exhibited by the first openings selectively;
   removing the first resist film and coating a second resist film on the mask substrate and delineating second openings in the second resist film;
   forming a test pattern on the mask substrate by etching the mask substrate exhibited by the second openings selectively and fabricating a plurality of asymmetrical diffracting portions that generate positive first order diffracting light and negative first order diffracting light in different diffraction efficiencies;
   removing the second resist film and coating a third resist film on the mask substrate and delineating the third openings in the third resist film; and
   forming a device pattern adjacent to the test pattern on the mask substrate by etching the mask substrate exhibited by the third openings selectively and fabricating a plurality of symmetrical diffracting portions that generate positive first order diffracting light and negative first order diffracting light in equal diffraction efficiencies.

8. The method of claim 7, after fabricating the asymmetrical diffracting portions, further comprises an additional etching of the mask substrate from sidewalls of the asymmetrical diffracting portions.

* * * * *